United States Patent
Rosenthal

(10) Patent No.: US 8,624,502 B2
(45) Date of Patent: *Jan. 7, 2014

(54) PARTICLE BEAM SOURCE APPARATUS, SYSTEM AND METHOD

(75) Inventor: Glenn B. Rosenthal, Los Angeles, CA (US)

(73) Assignee: Alpha Source LLC, Los Angeles, CA (US)

( * ) Notice: Subject to any disclaimer, the term of this patent is extended or adjusted under 35 U.S.C. 154(b) by 1046 days.

This patent is subject to a terminal disclaimer.

(21) Appl. No.: 12/504,513

(22) Filed: Jul. 16, 2009

(65) Prior Publication Data

US 2010/0289409 A1    Nov. 18, 2010

Related U.S. Application Data

(60) Provisional application No. 61/178,857, filed on May 15, 2009.

(51) Int. Cl.
  *H01J 7/24*    (2006.01)
(52) U.S. Cl.
  USPC .............. 315/111.81; 315/111.41; 315/502; 250/424; 250/423 R
(58) Field of Classification Search
  USPC ............ 315/111.81, 111.01, 111.11, 111.21, 315/111.31, 111.41, 111.51, 111.61, 315/111.71, 111.91; 250/423 R, 424, 250/425–427, 492.3
  See application file for complete search history.

(56) References Cited

U.S. PATENT DOCUMENTS

| | | |
|---|---|---|
| 4,580,120 A | 4/1986 | Jaqquot |
| 4,609,428 A | 9/1986 | Fujimura |
| 4,631,438 A | 12/1986 | Jacquot |
| 4,638,216 A | 1/1987 | Delaunay |
| 4,778,561 A | 10/1988 | Ghanbari |
| 4,780,642 A | 10/1988 | Jacquot |
| 4,857,809 A | 8/1989 | Torii et al. |
| 4,883,968 A | 11/1989 | Hipple |
| 5,256,938 A | 10/1993 | Xie |
| 5,350,974 A | 9/1994 | Jacquot |

(Continued)

FOREIGN PATENT DOCUMENTS

| | | |
|---|---|---|
| JP | 2003-257329 A | 9/2003 |
| WO | WO-02/063637 A | 8/2002 |

OTHER PUBLICATIONS

Buckner, M.R., et al, "Medical Isotope Production with the Accelerator Production of Tritium (APT) Facility", pp. 636-638.

(Continued)

*Primary Examiner* — Shawki Ismail
*Assistant Examiner* — Christopher Lo
(74) *Attorney, Agent, or Firm* — The Marbury Law Group, PLLC

(57) ABSTRACT

An ion source is disclosed including: a chamber disposed about a longitudinal axis and containing a gas, a magnetic confinement system configured to produce a magnetic field in a confinement region within the chamber, an electron cyclotron resonance driver which produces a time varying electric field which drives the cyclotron motion of electrons located within the confinement region, the driven electrons interacting with the gas to form a confined plasma. During operation, the magnetic confinement system confines the plasma in the confinement region such that a portion of atoms in the plasma experience multiple ionizing interactions with the driven electrons to form multiply ionized ions having a selected final ionization state.

95 Claims, 20 Drawing Sheets

(56) References Cited

U.S. PATENT DOCUMENTS

| | | | |
|---|---|---|---|
| 5,482,611 A | 1/1996 | Helmer | |
| 5,506,475 A * | 4/1996 | Alton | 315/111.41 |
| 5,528,034 A | 6/1996 | Yamazaki | |
| 5,841,237 A | 11/1998 | Alton | |
| 5,920,601 A | 7/1999 | Nigg et al. | |
| 5,969,470 A | 10/1999 | Druz | |
| 5,993,538 A | 11/1999 | Asakawa | |
| 6,150,755 A | 11/2000 | Druz | |
| 6,194,836 B1 | 2/2001 | Pacquet | |
| 6,335,535 B1 * | 1/2002 | Miyake et al. | 250/492.21 |
| 6,455,844 B1 | 9/2002 | Meyer | |
| 6,495,842 B1 * | 12/2002 | Huttel et al. | 250/492.3 |
| 6,683,318 B1 | 1/2004 | Haberer | |
| 6,809,325 B2 | 10/2004 | Dahl | |
| 6,922,019 B2 | 7/2005 | Leung et al. | |
| 7,196,337 B2 * | 3/2007 | Mikolas | 250/423 R |
| 7,461,502 B2 | 12/2008 | Emsellem | |
| 7,544,952 B2 | 6/2009 | Sakurai | |
| 7,687,786 B2 | 3/2010 | Parrill | |
| 7,689,367 B2 | 3/2010 | Mills | |
| 2004/0069958 A1 | 4/2004 | Dahl | |
| 2005/0118098 A1 | 6/2005 | Vincent | |
| 2006/0023829 A1 | 2/2006 | Schenter et al. | |
| 2008/0087842 A1 | 4/2008 | Sakurai | |
| 2009/0124159 A1 | 5/2009 | Briand | |
| 2011/0044418 A1 | 2/2011 | Stubbers et al. | |

OTHER PUBLICATIONS

Kelly, Karen Corzine, "Gadolinium-148 and Other Spallation Production Cross Section Measurements for Accelerator Target Facilities", A Dissertation Presented to The Academic Faculty, Nuclear and Radiological Engineering, Georgia Institute of Technology, pp. 1-128, 2004.

International Atomic Energy Agency, "Cyclotron Produced Radionuclides: Principles and Practice", Technical Reports Series No. 465; IAEA, Vienna, Austria, pp. 1-215, 2008.

International Atomic Energy Agency, "Cyclotron Produced Radionuclides: Physical Characteristics and Production Methods", Technical Reports Series No. 468, pp. 1-266, 2009.

Machnik, S.G. et al, "Computer Study of Isotope Production for Medical and Industrial Applications in High Power Accelerators", Sixteenth International Conference on the Application of Accelerators in Research and Industry, pp. 1-4, 2000.

Lambrecht, Richard M et al, "Alice predictions on the accelerator production of molybdenum-99", *Applied Radiation and Isotopes*, vol. 51, pp. 177-182, 1999.

Wallenius, Janne, "Transmutation of Nuclear Waste", pp. 1-14.

"A Roadmap for Developing Accelerator Transmutation of Waste (ATW) Technology", A Report to Congress, pp. 1-108, 1999.

Pindzola, M.S. et al, "Electron-impact single and double ionization of helium", *Physical Review A*, vol. 70, pp. 032705-1-032705-10, 2004.

Geyer, Tihamer, "Electron impact double ionization of helium from classical trajectory calculations", *Journal of Physics B : Atomic, Molecular and Optical Physics*, vol. 37, pp. 1215-1235, 2004.

Barnett, C.E. et al, "Charge Exchange Cross Sections for Helium Ions in Gases", *Physical Review*, No. 2, vol. 109, pp. 385-390, 1958.

Kim, Yong-Ki et al, "Binary-encounter-dipole model for electron-impact ionization", *Physical Review A*, No. 50, vol. 50, pp. 3954-3967, 1994.

Casez, I et al, "Absolute cross sections for charge-exchange in $^3$He$^{2+}$ and H$^+$ impact on CO", *Journal of Physics B : Atomic, Molecular and Optical Physics*, vol. 35, pp. 2515-2524, 2002.

Montague, R.G. et al, "A measurement of the cross section for ionization of helium by electron impact using a fast crossed beam technique", *Journal of Physics B: Atomic, Molecular and Optical Physics* : vol. 17, pp. 3295-3310, 1984.

Fritioff, Karin, "Simulations of the RF injection system for the ECR4", AB-division, CERN, Geneva, Switzerland, pp. 1-8, 2004.

Somacal, H. et al, "Simulations of election trajectories under the influence of an array of permanent magnets in a compact ion source", *Nuclear Instruments and Methods in Physics Research*, No. 490, vol. A, pp. 9-15, 2002.

Alexandrov, V et al, "Simulation and optimization of ion beam lines from ion sources", *Nuclear Instruments and Methods in Physics Research*, No. 205, vol. B, pp. 220-224, 2003.

Lyneis, C.M. et al, "Results with the superconducting electron cyclotron resonance ion source VENUS (invited)", *Review of Scientific Instruments*, No. 5, vol. 75, pp. 1389-1393, 2004.

Galloway, M.L. et al, "Recent Beam Developments with the LBNL14GHz AECR-Ulon Source", *High Energy Physics and Nuclear Physics*, pp. 1-4.

Leithner, D. et al, "Recent 28 GHz Results with Venus". *High Energy Physics and Nuclear Physics*, pp. 1-6.

Gammino, Santo, "R&D of ECR ion sources: news and perspectives", *Nukleonika*, vol. 48, Supplement 2, pp. S73-S79, 2002.

Leitner, M.A. et al, "Progress Report on Venus", pp. 1-3.

Leitner, M.A. et al, "Progress Report of the 3$^{rd}$ Generation ECR Ion Source Fabrication", *Lawrence Berkeley National Laboratory*, pp. 1-5.

Xie, Z.Q., "Production of highly charged ion beams from electron cyclotron resonance ion sources (invited)", *Review of Scientific Instruments*, No. 2, vol. 69, pp. 625-630, 1998.

Gammino, S. et al, "Operations of the Serse Superconducting ECR Ion Source at 28GHz", Cyclotrons and Their Applications 2001, Sixteenth International Conference, *American Institute of Physics*, pp. 223-227, 2001.

Leitner, D. et al, "Next Generation ECR ion sources: First results of the superconducting 28 GHz ECRIS-VENUS", *Nuclear Instruments and Methods in Physics Research*, No. 235, vol. B, pp. 486-493, 2005.

Ciavola, Giovanni et al, "Eurons—European Nuclear Structure research" pp. 1-8.

Reijonen, Jani et al, "Microwave Ion Source for Low Charge State Ion Production", Lawrence Berkeley National Laboratory (University of California), Paper LBNL-52458, pp. 1-12, 2003.

Donets, Evgeni D., "Historical Review of Election Beam Ion Sources (invited)", *Review of Scientific Instruments*, No. 2, vol. 69, pp. 614-619, 1998.

Wutte, D. et al, "High intensity metal ion beam production with ECR ion sources at the Lawrence Berkeley National Laboratory", *Review of Scientific Instruments*, No. 2, vol. 72, pp. 521-524, 2002.

Wutte, D., et al, "High intensity ion beam injection into the 88-inch cyclotron" Lawrence Berkeley National Laboratory; University of California, Paper LBNL-47326, pp. 1-6, 2008.

Gammino, S. et al, "High intensity beams from electron cyclotron reasonance ion sources: A study of efficient extraction and transport system (invited)", *Review of Scientific Instruments*, No. 5, vol. 75, pp. 1637-1642, 2004.

Leithner, D., "First Results of the Superconducting ECR Ion Source Venus with 28 GHz", Lawrence Berkeley National Laboratory, pp. 1-7.

Dekamp, J.C., et al, "Fabrication and Testing of the Magnet System for SuSl Superconducting Source for ions", *IEEE Transactions on Applied Superconductivity*, No. 2, vol. 17, pp. 1217-1220, 2007.

Wutte, D., et al; "Emittance Measurement for High Charge State Ion Beams Extracted from the AECR-U Ion Source"; *Physica Scripta.*, T92, pp. 247-249, 2001.

Leitner, D., et al, "Development of ECR Ion Sourcr and LEBT Technology for RIA", Prepared for the Rare Isotope Accelerator (RIA) Research and Development Workshop, pp. 1-7, 2003.

Leitner, M.A. et al, "Design of the Extraction System of the Superconducting ECR Ion Source Venus", LBNL, pp. 1-3.

Zavodsky, P.A., et al, "Design of SuSl-superconducting source for ions at NSCL/MSU-II. The conventional parts", *Nuclear Instruments and Methods in Physics Research*, No. 241, vol. B. pp. 959-964, 2005.

Leitner, M.A., et al, "Construction of the Superconducting ECR Ion Source Venus"; *Physica Scripta*, T92, pp. 171-173, 2001.

Humphries, Jr., Stanley; "Charged Particle Beams; Department of Electrical and Computer Engineering", University of New Mexico, pp, 1-847, 2002.

(56) References Cited

OTHER PUBLICATIONS

Drentje, A.G., et al, "Can a Hexapole magnet of an ECR Ion Source be too strong?", K.V.I. University Groningen, pp. 1-5.

Ciavola, G., et al, "Beamline design for the transport of high intensity beams"; *Nuclear Instruments and Methods in Physics Research*, No. 204, vol. B, pp. 410-415, 2003.

Swenson, Donald, et al, "A 25-Ke V, 30-Milliamp Hydrogen-ion Injector for a 200-MHz, 750-Ke V Radiofrequency Quadrupole", Proceedings of PAC07, pp. 1838-1840.

Krejcik, P, "Waveguide Stub-line Tuning of RF Cavities with Heavy Beam Loading", Stanford Linear Accelerator Center, Stanford University, pp. 3030-3032, 1998.

Iatrou, Christos T. et al, "Field Analysis of Rectangular Waveguide Open Junction", *IEEE Transactions on Microwave Theory and Techniques*, No. 2, vol. 45, pp. 165-172, 1997.

Kasparek, W. et al, "Development of transmission lines at frequencies of 28-37 GHz for application with ECR ion sources", pp. 55-56.

Fu, S. et al, "Simulation study on ion extraction from electron cyclotron resonance ion sources", *American Institute of Physics*, No. 4, vol. 65, pp. 1435-1437, 1993.

Wang, H.S. et al, "Numerical simulation research of a high-current ion source extraction system for nuclear fusion", American Institute of Physics, No. 3, vol. 67, pp. 1067-1067, 1996.

Becker, Reinard, "Numerical stimulation of ion-beam formation (invited)", *American Institute of Physics*, No. 3, Vol. 67, pp. 1132-1137, 1996.

Keller, Roderich, "Ion extraction systems: optics and design", *Nuclear Instruments and Methods in Physics Research*, Section IV, Election and ion optics, A298, pp. 247-254, 1990.

Becker, R. et al, "IGUN—A program for the simulation of positive ion extraction including magnetic fields", *American Institute of Physics*, No. 4, vol. 63, pp. 2756-2758, 1992.

Ueda, Yoshio et al, "Effects of sheath potential of source plasma on characteristics of low energy beam extraction", *American Institute of Physics*; No. 8, vol. 65, pp. 2587-2593, 1994.

Whitson, J.C. et al, "Calculations Involving Ion Beam Source" *Journal of Computational Physics*, vol. 28, pp. 408-415, 1978.

Sarstedt, M. et al, "Beam emittance measurements on multicusp ion sources", *American Institute of Physics*, No. 3, vol. 67, pp. 1249-1251, 1996.

Reijonen, J. et al, "An improved extraction for the multicusp-type light ion-ion source apparatus", *Review of Scientific Instruments*, No. 2, vol. 69, pp. 1138-1140, 1998.

Coupland, J.R. et al, "A Study of the Ion Beam Intensity and Divergence Obtained from a Single Aperture Three Electrodes Extraction System", *American Institute of Physics*, No. 9, vol. 44, pp. 1258-1270, 1973.

Whealton, J.H. et al, "A Finite Difference 3-D Possion-Vlasov Algorithm for Ions Extracted from a Plasma", *Journal of Computational Physics*, vol. 63, pp. 20-32, 1986.

Communication pursuant to Article 94(3) EPC dated Sep. 12, 2012 for EP 09790533.5, 4 pages.

Haba H. et Al: "Startup of Super Heavy Element Chemistry at Riken" Mar. 28, 2007; The European Physical Journal D; Atomic, Molecular and Optical Physics, Societa Italiana Di Fisica, p. 81-86, XP019520647.

International Search Report and Written Opinion PCT/US2009/050839 Mar. 2, 2010.

Invitation to Pay Additional Fees PCT/US2009/050839 dated Nov. 27, 2009.

Invitation to Pay Additional Fees PCT/US2009/050843 dated Nov. 27, 2009.

M. Schlapp, R.C. Pardo, R.C. Vondrasek et al: "A New 14 GHz Electron-Cyclotron-Resonance Ion Source for the Heavy Ion Accelerator Facility Atlas" Review of Scientific Instruments, vol. 69, No. 2, 1998, pp. 631-633, XP002552914.

Morita Et Al: "Superheavy Research in Japan" Apr. 1, 2009. Progress in Particle and Nuclear Physics, Pergamon pp. 325-336, XP026019600.

Nakagawa Et al: "Production of <70>Zn beam from Riken 18GHz ECR Ion Source" Jan. 23, 2007; Nuclear Instruments & Methods in Physics Research, Section-B: Beam Interactions with Materials and Atoms, Elsevier, Amsterdam, NL. pp. 337-339, XP005855794.

Nakagawa T. et al: "Production of Multi-Charged Ions in the Riken 18 GHz Ecris" Nov. 1, 2004, Nuclear Instruments & Methods in Physics Research, Section-B: pp. 392-400, XP004655356.

US Office Action on U.S. Appl. No. 12/504,479 DTD Apr. 10, 2012.

\* cited by examiner

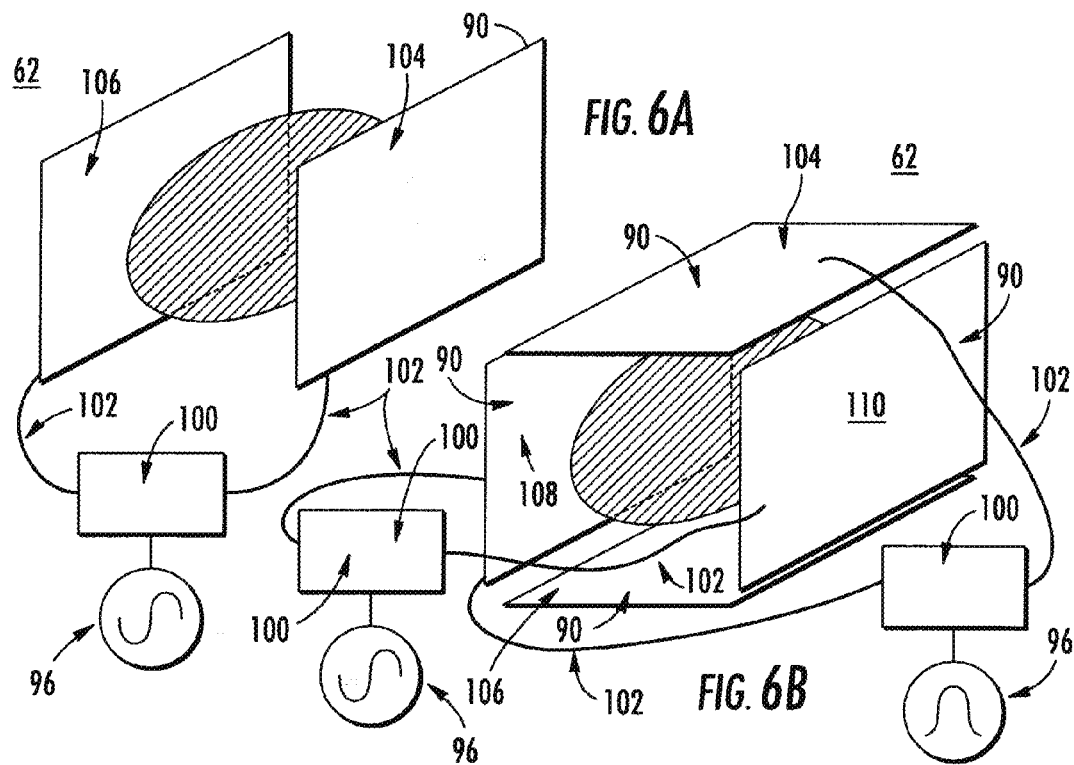
FIG. 6A
FIG. 6B
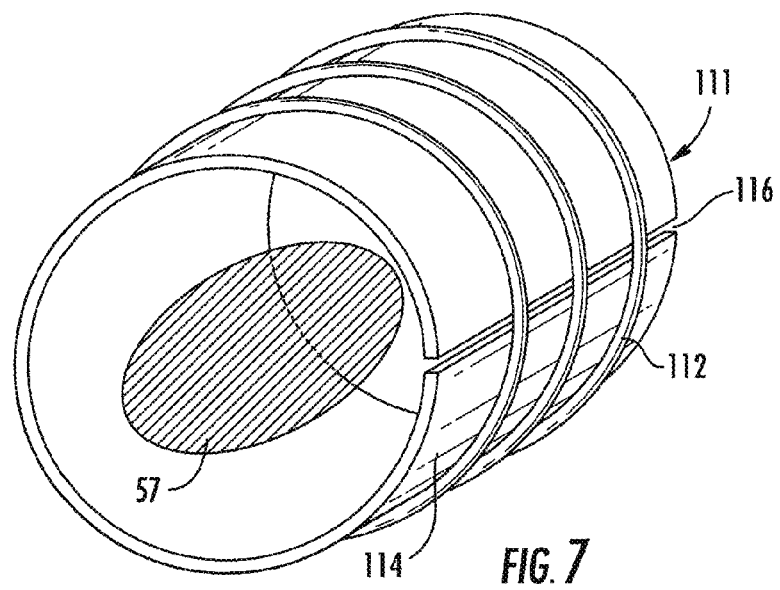
FIG. 7

PARTICLE BEAM SOURCE APPARATUS, SYSTEM AND METHOD

CROSS REFERENCE TO RELATED APPLICATION

This application is related to and claims benefit of U.S. Provisional Application 61/178,857 filed May 15, 2009, the contents of which are incorporated by reference in their entirety.

BACKGROUND

This disclosure is related to ion sources, and more particularly to high intensity ion sources.

Ion sources may be used to generate ion beams useful in a number of applications. For example, the beams may be used to bombard targets to drive nuclear reactions for the production of isotopes.

Some ions sources ionize neutral targets via collisions with energetic electrons. Electron Cyclotron Resonant (ECR) plasma sources generate energetic electrons by exciting the cyclotron motion of the electrons within a magnetic field. The ECR plasma source is located in a vacuum chamber to control the gas that is ionized, and to reduce the pressure allowing the electrons to reach ionization energy.

A charged particle placed in a uniform magnetic field will gyrate around the magnetic field with a frequency given by the electron cyclotron frequency.

$$\omega_{ce} = \frac{eB}{m}$$

If the magnetic field is not uniform, the electron still gyrates around the magnetic field, but the orbit and frequency become somewhat more complicated. ECR ion sources do not require a uniform magnetic field to operate. In fact, many of them operate in highly non-uniform magnetic fields. By applying an oscillating electric field, the cyclotron motion of the electrons can be excited. If the oscillating electric field is resonant with the electron cyclotron frequency and couples to the electron motion, the electrons will gain energy. The highest coupling would be an electric field that rotated about the magnetic field in the same direction as the electrons, and at the same rate. This electric field would look like a DC electric field in the frame of the electrons. Good coupling can also be obtained with a linear polarized electric field that oscillates perpendicular to the magnetic field. As the electrons gain energy they will collide with any gas within the source, ionizing the background gas. This forms plasma and creates more electrons that can ionize more background gas. This prior art process continues as the plasma density increases until losses are balanced with production.

In prior art devices, the balance occurs long before a powerful beam can be generated, and a powerful beam is what is needed to strike and transmute target material into such things as useful medical isotopes. Many isotopes are, in theory, thought to be useful, but heretofore their small obtainable quantities and short half lives, prevent their use.

SUMMARY

The inventors have realized that a high intensity source of multiply charged ions in a selected ionization state may be provided. For example, some embodiments of the devices, systems and techniques described herein produce a high density beam of ions, useful in producing long and/or short half-live isotopes or for use directly (e.g. for the treatment of tumors). Some embodiments produce a beam of multiply ionized particles in selected final ionization state. Some embodiments produce a high density beam of ions that are highly ionized. Some embodiments produce a beam of multiply ionized He relatively economically.

Some embodiments use ion beams to transmute atoms and isotopes into useful isotopes that can not be produced in quantity by other means. Some embodiments enable production of isotopes, heretofore not available in useful quantities.

Some embodiments use ion beams to transmute isotopes, such as those produced in commercial nuclear power plants, into fuel that can be recycled into the reactor. Some embodiments provide a machine which can be sited adjacent a commercial nuclear power plant to transmute long half life isotopes, such as those produced in commercial nuclear power plants, into short half life isotopes which quickly decay into stable atoms without the requirement of transportation or burial.

In one aspect, an ion source is disclosed including: a chamber disposed about a longitudinal axis and containing a gas. The source includes a magnetic confinement system configured to produce a magnetic field in a confinement region within the chamber, where the confinement region is disposed about the axis and extends along the axis from a proximal end to a distal end. The magnetic field includes: a first magnetic mirror located at the proximal end of the confinement region; a second magnetic mirror located at the distal end of the confinement region; and a substantially uniform magnetic field disposed about and directed substantially parallel to the longitudinal axis, the substantially uniform magnetic field being located between the first and second magnetic mirrors. The system also includes an electron cyclotron resonance driver which produces a time varying electric field which drives the cyclotron motion of electrons located within the confinement region, the driven electrons interacting with the gas to form a confined plasma. During operation, the magnetic confinement system confines the plasma in the confinement region such that a portion of atoms in the plasma experience multiple ionizing interactions with the driven electrons to form multiply ionized ions having a selected final ionization state.

In some embodiments, the first and second magnetic mirrors each include a non-uniform magnetic field, where the field: is directed substantially along the longitudinal axis, and has a magnitude which increases as a function of axial distance from the substantially uniform magnetic field to a peak magnitude greater than the magnitude of the substantially uniform magnetic field. In some such embodiments, the peak magnitude of the first magnetic mirror is greater than the peak magnitude of the second magnetic mirror. In some embodiments, the peak magnitude of the mirrors may be equal or substantially equal. In some embodiments, the peak magnitude of each of the first and second magnetic mirrors is greater than about twice the magnitude of the substantially uniform magnetic field. In some embodiments the peak magnitude of each of the first and second magnetic mirrors may take any other suitable values, e.g., one and a half, three, four, five, or more times the magnitude of the substantially uniform magnetic field.

In some embodiments, the magnitude of the substantially uniform magnetic field is a local axial minimum of the magnetic field in the confinement region.

Some embodiments include an extractor for extracting a beam of ions from the confinement region, where the beam includes a portion of the multiply ionized ions in the selected final ionization state.

In some embodiments, the ion beam has a current of 1 mA or greater, 10 mA or greater, 20 mA or greater, or even 50 mA or greater.

In some embodiments, at least 50% of the ions in the beam (as measured by particle fraction, or as a percentage of total beam current) are in the selected final ionization state. In some embodiments, at least 60%, 70%, 80%, or 90% of the ions in the beam are in the selected final ionization state.

In some embodiments, the electron cyclotron resonance driver produces a time varying electric field having a frequency substantially tuned to the electron cyclotron resonance frequency corresponding to the substantially uniform magnetic field In some embodiments, the electron cyclotron resonance driver drives the cyclotron motion of electrons located throughout a volume containing the substantially uniform magnetic field.

In some embodiments, the magnitude of the substantially uniform magnetic field varies by less than 1%, less than 5%, or less than 10% over a region disposed about the longitudinal axis, the region located between (e.g. midway between) the first and second magnetic mirrors and extending along the longitudinal axis over a distance equal to at least about 10%, 15%, 25%, or even more of the axial distance between the first and second magnetic mirrors.

In some embodiments, the magnitude of the substantially uniform magnetic field varies by less than 1%, less than 5%, or less than 10% over a region extending at least 5 cm, 10 cm, 15 cm, or greater along the longitudinal axis.

In some embodiments, the magnetic field is azimuthally symmetric about the longitudinal axis throughout the confinement region.

In some embodiments, the electron cyclotron de-correlation time for electrons driven by the electron cyclotron resonance driver is at least on the order of an average confinement time for a heated electron in the confinement region.

In some embodiments, the electron cyclotron resonance driver drives at least a portion of the electrons in the volume to an energy of about 200 eV or more, about 300 eV or more, or about 1 keV or more.

Some embodiments include an ion cyclotron driver, which directs radiation to the confinement region to preferentially drive the cyclotron motion of ions in the plasma having a selected driven ionization state to increase the motional energy of the ions in directions perpendicular to the longitudinal axis. In some embodiments, the ion cyclotron driver preferentially increases the confinement time in the confinement region of the ions having selected driven ionization state, thereby increasing the number of the ions undergoing further ionizing interactions with the electrons in the containment region to form ions having the selected final ionization state. In some embodiments, the ion cyclotron driver directs radiation to the confinement region having a frequency substantially tuned to the ion cyclotron frequency of the ions having the selected driven ionization state in the substantially uniform magnetic field. In some embodiments, the selected driven ionization state is a singly ionized state. In some embodiments, the selected driven ionization state is a multiply ionized state having an ionization state less than the final ionization state.

In some embodiments, the ion cyclotron driver directs radiation to the confinement region at a plurality of frequencies each substantially tuned to the ion cyclotron frequency of ions having a respective selected driven ionization state in the substantially uniform magnetic field, In some embodiments, the ion cyclotron driver includes an antenna such as a filar antenna (e.g. a single or bi-filar), a capacitor plate, an untwisted bi-filar antenna or an untwisted filar antenna, or combinations thereof.

In some embodiments, at least one magnetic mirror includes a magnetic field extending outside of the confinement region. The electron cyclotron driver is tuned to the electron cyclotron frequency corresponding to a portion of the magnetic field extending outside of the confinement region to drive the cyclotron motion of unconfined electrons in the portion of the field, where the unconfined electrons interact with the gas to form an unconfined plasma. The ion source further includes a sputter target located in the chamber and proximal to the portion of the magnetic field, and biased to attract ions from the unconfined plasma. In response to collisions with the attracted ions, the sputter source emits neutral particles which form at least a portion of the gas of atoms. In some embodiments, at least a portion of the emitted neutral particles interact with the unconfined electrons to form ions which are attracted back to the sputter source.

In some embodiments, the sputter target includes an annulus of material disposed about the longitudinal axis, an annulus of material disposed about the longitudinal axis and having a target surface which is angled with respect to the longitudinal axis, or target material positioned about and extending along the longitudinal axis, or combinations thereof.

In some embodiments, the gas includes He atoms, and the magnetic confinement system confines the plasma in the confinement region such that a portion of He atoms in the plasma experience two singly ionizing interactions with the driven electrons to form alpha particles or $^3He^{++}$ ions. Some such embodiments include an extractor for extracting a beam of He ions from the confinement region, where the beam includes alpha particles and/or $^3He^{++}$ ions.

In some embodiments, the beam of He ions has a current of 1 mA or greater, 10 mA, or 20 mA or greater. In some embodiments, at least 50%, at least 70%, at least 80%, or at least 90% or more of the ions in the beam are alpha particles and/or $^3He^{++}$ ions.

In some embodiments, the magnetic confinement system is further configured to produce a radial confinement magnetic field which confines the radial motion of the plasma away from the longitudinal axis. The radial confinement magnetic field does not substantially extend into the substantially uniform magnetic field. In some embodiments, magnetic confinement system includes a multipole radial confinement magnet disposed about the longitudinal axis which produces a magnetic field directed azimuthally to the longitudinal axis and having a magnitude which decreases radially with increasing proximity to the axis, except along one or more cusps. In some embodiments, the multipole magnet includes 8 or more poles.

In some embodiments, the electron cyclotron resonance driver produces a time varying electric field having a frequency substantially de-tuned to the electron cyclotron resonance frequency corresponding to the substantially uniform magnetic field. In some embodiments, the electron cyclotron resonance driver drives the cyclotron motion of electrons located in a first region of non-uniform magnetic field distal the substantially uniform magnetic field along the longitudinal axis and a second region of non-uniform magnetic field proximal the substantially uniform magnetic field along the longitudinal axis. In some embodiments, each of the first and second regions of non-uniform magnetic field include a surface of points characterized such that the frequency of the time varying electric field is tuned to the electron cyclotron resonance frequency of the non-uniform magnetic field at the points.

In some embodiments, the substantially uniform magnetic field has a magnitude of about 0.1 T or greater, 0.5 T or greater, or 6 T or greater.

In some embodiments, the gas includes molecules, and the driven electrons interact with the gas to disassociate the molecules to form the confined plasma.

In another aspect, a method of generating an ion beam is disclosed, including: providing a chamber disposed about a longitudinal axis and containing a gas and producing a magnetic field in a confinement region within the chamber, where the confinement region is disposed about the axis and extends along the axis from a proximal end to a distal end. The magnetic field includes: a first magnetic mirror located at the proximal end of the confinement region; a second magnetic mirror located at the distal end of the confinement region; a substantially uniform magnetic field disposed about and directed substantially parallel to the longitudinal axis, the substantially uniform magnetic field being located between the first and second magnetic mirrors. The method further includes producing a time varying electric field to drive the cyclotron motion of electrons located within the confinement region; causing the driven electrons interacting with the gas to form a confined plasma; and confining the plasma in the confinement region such that a portion of atoms in the plasma experience multiple ionizing interactions with the driven electrons to form multiply ionized ions having a selected final ionization state.

In some embodiments, the first and second magnetic mirrors each include a non-uniform magnetic field, where the field is directed substantially along the longitudinal axis and has a magnitude which increases as a function of axial distance from the substantially uniform magnetic field to a peak magnitude greater than the magnitude of the substantially uniform magnetic field, In some embodiments, the peak magnitude of the first magnetic mirror is greater than the peak magnitude of the second magnetic mirror (in other embodiments they may be equal or substantially equal).

In some embodiments, a peak magnitude of each of the first and second magnetic mirrors is greater than about twice (or 1.5, 3, 4, 5, etc times) the magnitude of the substantially uniform magnetic field.

In some embodiments, the magnitude of the substantially uniform magnetic field is a local axial minimum of the magnetic field in the confinement region.

Some embodiments further include extracting the ion beam from the confinement region, where the beam includes a portion of the ions which are in the selected final ionization state. In some embodiments, the ion beam has a current of 1 mA or greater, 10 mA or greater, 20 mA or greater, or 50 mA or greater.

In some embodiments, at least 50%, 60%, 70%, 80% or 90% or more of the ions are in the selected final ionization state.

In some embodiments, the time varying electric field has a frequency substantially tuned to the electron cyclotron resonance frequency corresponding to the substantially uniform magnetic field. In some embodiments, the electron cyclotron resonance driver drives the cyclotron motion of electrons located throughout a volume surrounding the substantially uniform magnetic field.

In some embodiments, the magnitude of the substantially uniform magnetic field varies by less than 1%, 5%, 10%, or 15% over a region disposed about the longitudinal axis, the region located midway between the first and second magnetic mirrors and extending along the longitudinal axis over a distance equal to at least about 5%, 10%, 25%, 50%, or more of the axial distance between the first and second magnetic mirrors.

In some embodiments, the magnitude of the substantially uniform magnetic field varies by less than 1%, 2.5%, 5%, or 10% over a region extending at least 1 cm, 2 cm, 5 cm, 10 cm, 15 cm, or 25 cm or more along the longitudinal axis.

In some embodiments, the magnetic field is azimuthally symmetric about the longitudinal axis throughout the confinement region.

In some embodiments, the electron cyclotron de-correlation time for the driven electrons is at least on the order of an average confinement time for a heated electron in the confinement region.

Some embodiments include driving the cyclotron motion of electrons located within the confinement region to produce an electron energy of about 200 eV or more, 300 eV or more, or 1 keV or more.

Some embodiments further include directing radiation to the confinement region to preferentially drive the cyclotron motion of ions in the plasma having a selected driven ionization state to increase the motional energy of the ions in directions perpendicular to the longitudinal axis. In some embodiments, directing radiation to the confinement region to preferentially drive the cyclotron motion of ions in the plasma having a selected driven ionization state includes preferentially increasing the confinement time in the confinement region of the ions having selected driven ionization state, thereby increasing the number of the atoms undergoing further ionizing interactions with the electrons in the containment region. In some embodiments, directing radiation to the confinement region to preferentially drive the cyclotron motion of ions in the plasma having a selected driven ionization state includes: directing radiation to the confinement region having a frequency substantially tuned to the ion cyclotron frequency of the ions having the selected driven ionization state in the substantially uniform magnetic field. In some embodiments, the selected driven ionization state is a singly ionized state. In some embodiments, the selected driven ionization state is a multiply ionized state having an ionization state less than the final ionization state. Some embodiments include directing radiation to the confinement region at a plurality of frequencies, each frequency substantially tuned to the ion cyclotron frequency of ions having a respective selected driven ionization state in the substantially uniform magnetic field, In some embodiments, directing radiation to the confinement region to preferentially drive the cyclotron motion of ions in the plasma having a selected driven ionization state includes: directing radiation from an antenna of the types disclosed herein.

In some embodiments, at least one magnetic mirror includes a magnetic field extending outside of the confinement region. The frequency of the time varying electric field is tuned to the electron cyclotron frequency corresponding to a portion of the magnetic field extending outside of the confinement region to drive the cyclotron motion of unconfined electrons in the portion of the field, where the unconfined electrons interact with the gas to form an unconfined plasma. The method may further include providing a sputter target located in the chamber and proximal to the portion of the magnetic field and biasing the sputter target to attract ions from the unconfined plasma, such that, in response to collisions with the attracted ions, the sputter source emits neutral particles which form at least a portion of the gas of atoms. In some embodiments, at least a portion of the emitted neutral particles interact with the unconfined electrons to form ions which are attracted back to the biased sputter source. In some embodiments, the sputter target includes an annulus of material disposed about the longitudinal axis; an annulus of material disposed about the longitudinal axis and having a target surface which is angled with respect to the longitudinal axis, or a target material positioned about and extending along the longitudinal axis, or combinations thereof.

In some embodiments, the gas includes He atoms, and the method includes confining the plasma in the confinement region such that a portion of the He atoms in the plasma experience two singly ionizing interactions with the driven electrons to form alpha particles or $^3\text{He}^{++}$.

Some embodiments include extracting a beam of He ions from the confinement region, where the beam includes alpha particles or $^3\text{He}^{++}$ ions. In some embodiments, the beam of He atoms has a current of 1 mA or greater, or 20 mA or greater. In some embodiments, at least 50%, 60%, 70%, 80%, or 90% or more of the ions in the beam are alpha particles. In some embodiments at least 50%, 60%, 70%, 80%, or 90% or more of the ions in the beam are or $^3\text{He}^{++}$.

Some embodiments further include producing a radial confinement magnetic field which confines the plasma radially. The radial confinement magnetic field does not substantially extend into the substantially uniform magnetic field. In some embodiments, producing a radial confinement magnetic field includes producing a magnetic field directed azimuthally to the longitudinal axis and having a magnitude which decreases radially with increasing proximity to the axis, except along one or more cusps.

Some embodiments include producing a time varying electric field having a frequency substantially de-tuned to the electron cyclotron resonance frequency corresponding to the substantially uniform magnetic field. Some embodiments include driving the cyclotron motion of electrons located in a first region of non-uniform magnetic field distal the substantially uniform magnetic field along the longitudinal axis and a second region of non-uniform magnetic field proximal the substantially uniform magnetic field along the longitudinal axis. In some embodiments, each of the first and second regions of non-uniform magnetic field include a surface of points at which the frequency of the time varying electric field is tuned to the electron cyclotron resonance frequency of the non-uniform magnetic field at the points. Some such embodiments include effecting stochastic heating of electrons in the confinement region which pass through the first and second regions multiple times.

In some embodiments, the substantially uniform magnetic field has a magnitude of about 0.1 T or greater, 0.5 T or greater or 0.6 T or greater.

In some embodiments, the gas includes molecules, and the causing the driven electrons interacting with the gas to form a confined plasma includes disassociating the molecules.

In another aspect, a method is disclosed including: generating an ion beam using any of the devices and techniques described herein, directing the ion beam to a target including a target material; and transmuting at least a portion of the target material to a radio-isotope by a nuclear reaction between ions in the selected final ion state and atoms of the target material.

In some embodiments, the atoms of the target material have a longer half life than the radio-isotope.

In some embodiments, the ions in the selected final ion state include alpha particles or $^3\text{He}^{++}$ ions.

In some embodiments, the nuclear reaction between ions in the selected final ion state and atoms of the target material include at least one from the list consisting of: $^{96}\text{Zr}$ ($\alpha$, n) $^{99}\text{Mo}$, $^{209}\text{Bi}$ ($\alpha$, 2n) $^{211}\text{At}$, $^{144}\text{Sm}$ ($\alpha$, $\gamma$) $^{148}\text{Gd}$, $^{116}\text{Cd}$ ($\alpha$, 3n) $^{117m}\text{Sn}$ and $^{114}\text{Cd}(\alpha, n)$ $^{117m}\text{Sn}$ and $^{147}\text{Sm}$ ($\alpha$, 3n) $^{148}\text{Gd}$.

In some embodiments, where the radio-isotope includes $^{99}\text{Mo}$, and the method further includes: generating a diagnostic or therapeutic effective dose of $^{99m}\text{Tc}$ from the $^{99}\text{Mo}$ by negative beta decay. In some embodiments, the entire diagnostic or therapeutic effective dose of 99m Tc is generated without the use of a nuclear fission reactor.

In some embodiments, the radio-isotope includes $^{111}\text{In}$, and the method further includes: generating a diagnostic or therapeutic effective dose of $^{111}\text{In}$. In some embodiments, the entire diagnostic or therapeutic effective dose of $^{111}\text{In}$ is generated without the use of a nuclear fission reactor.

In some embodiments, the radio-isotope includes at least one selected from the list consisting of: $^{18}\text{F}$, $^{123}\text{Xe}$, $^{123}\text{I}$, $^{67}\text{Ga}$, $^{111}\text{In}$, $^{131}\text{Ba}$, $^{68}\text{Ge}$, $^{82}\text{Sr}$, $^{82}\text{Rb}$, $^{89}\text{Sr}$, $^{153}\text{Sm}$, $^{124}\text{I}$, $^{211}\text{At}$, $^{148}\text{Gd}$, $^{76}\text{Br}$, $^{100}\text{Tl}$, $^{100}\text{Pd}$, $^{128}\text{Ba}$, $^{117m}\text{Sn}$, and $^{229}\text{Th}$.

In some embodiments, the nuclear reaction includes fission of atoms in the target material stimulated by bombardment with the ions in the selected final state.

In some embodiments, the target includes a layer of a first target material overlaying a second target material, The method further includes: directing the ion beam at a first energy to the layer of first target material such that a first portion of the ions in the beam transmute a portion of the first target material into a first radio-isotope by a first nuclear reaction between the first portion of ions and atoms of the first target material; a second portion of the ions in the beam interact with the layer to be decelerated to a second energy, and the second portion of the ions in the beam transmute a portion of the second target material into a second radio-isotope by a second nuclear reaction between the second portion of ions and atoms of the second target material. In some embodiments, the ions at the first energy more preferentially drive the first nuclear reaction than the second nuclear reaction, and the ions at the second energy more preferentially drive the second nuclear reaction than the first nuclear reaction. In some embodiments, the first target material includes $^{109}\text{Ag}$, the second target material includes $^{96}\text{Zr}$, the first nuclear reaction includes $^{109}\text{Ag}$ ($\alpha$, 2n) $^{111}\text{In}$, the second nuclear reaction includes $^{96}\text{Zr}$ ($\alpha$, n) $^{99}\text{Mo}$, the first energy is about 28 MeV, and the second energy is about 16 MeV.

In another aspect, an isotope generation apparatus is disclosed including: an ion beam source of any of the types described herein; an extractor for extracting the ion beam from the confinement region, where the beam includes a portion of multiply ionized ions in a selected final ionization state; a target including a target material; and an accelerator for accelerating the ion beam and directing the ion beam to the target. The ion beam directed to the target transmutes at least a portion of the target material to a radio-isotope in response to a nuclear reaction between ions in the selected final ion state and atoms of the target material.

In some embodiments, the atoms of the target material have a longer half life than the radio-isotope.

In some embodiments, the ions in the selected final ion state include alpha particles or $^3\text{He}^{++}$ ions.

In some embodiments, the nuclear reaction between ions in the selected final ion state and atoms of the target material include $^{96}\text{Zr}$ ($\alpha$, n) $^{99}\text{Mo}$, $^{209}\text{Bi}$ ($\alpha$, 2n) $^{211}\text{At}$, $^{144}\text{Sm}$ ($\alpha$, $\gamma$) $^{148}\text{Gd}$, and/or $^{147}\text{Sm}$ ($\alpha$, 3n) $^{148}\text{Gd}$.

In some embodiments, the radio-isotope includes $^{18}\text{F}$, $^{123}\text{Xe}$, $^{123}\text{I}$, $^{67}\text{Ga}$, $^{111}\text{In}$, $^{131}\text{Ba}$, $^{68}\text{Ge}$, $^{82}\text{Sr}$, $^{82}\text{Rb}$, $^{89}\text{Sr}$, $^{153}\text{Sm}$, $^{124}\text{I}$, $^{211}\text{At}$, $^{148}\text{Gd}$, $^{76}\text{Br}$, $^{199}\text{Tl}$, $^{100}\text{Pd}$, $^{128}\text{Ba}$, and/or $^{229}\text{Th}$.

In some embodiments, the target includes a layer of a first target material overlaying a second target material.

In some embodiments, the accelerator directs the ion beam at a first energy to the layer of first target material such that: a first portion of the ions in the beam transmute a portion of the first target material into a first radio-isotope by a first nuclear reaction between the first portion of ions and atoms of the first target material; a second portion of the ions in the beam interact with the layer to be decelerated to a second energy, and the second portion of the ions in the beam transmute a portion of the second target material into a second radio-isotope by a second nuclear reaction between the second portion of ions and atoms of the second target material. The ions at the first energy more preferentially drive the first nuclear reaction than the second nuclear reaction, and the ions at the second energy more preferentially drive the second nuclear reaction than the first nuclear reaction.

Various embodiments may include any of the above described features either alone or in any combination.

It is to be understood that as used herein, the term gas may refer to a single component gas (e.g. $^4$He gas), or a multi-component gas (e.g. $^3$He/$^4$He gas mix, a He/Xe gas mix, a He/O$_2$ gas mix, etc.).

Scientific notation known in the art has been used herein to describe various nuclear reactions. For a reaction described in the form A(b,c)D, "A" is the target nucleus, or irradiated material, "b" is a bombarding particle, "c" is an emitted particle, and "D" is the product or residual nucleus. For a reaction described in the form A(b,c)D1(D2), D1 and D2 primary and secondary products of the reaction.

These and other aspects of the present invention will become apparent to those skilled in the art after considering the following detailed specification along with the accompanying drawings where:

BRIEF DESCRIPTION OF THE DRAWINGS

FIGS. 6A and 6B are schematic diagrams of capacitor plate ICR antennae, FIG. 6A depicting a linear drive system and FIG. 6B depicting a circular drive system with the horizontal plates driven 90° out of phase with the vertical plates.

FIG. 7 is a schematic diagram of a split ring antenna system for the ICR;

DETAILED DESCRIPTION

Figure 1:
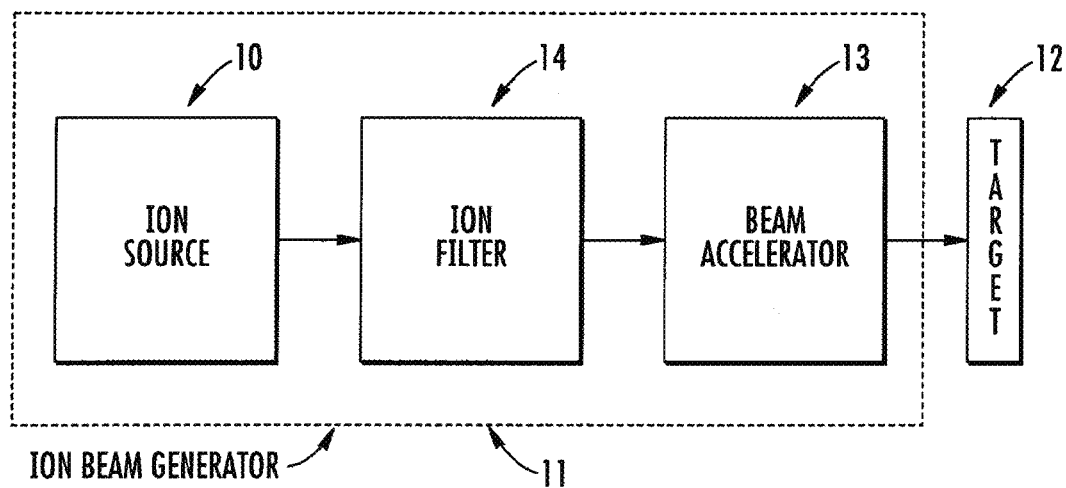
FIG. 1 is a block diagram of an ion beam system.

Referring to FIG. 1, an Ion beam generator 11 generates an ion beam and directs it to target 12 to cause a nuclear reaction, e.g. to transmute atoms in target 12 to produce a desired isotope. Ion beam generator 11 includes an ion source 10 of the type described herein, which produces a beam (e.g. a high intensity beam) including ions in a selected final ionization state. Ion beam generator 11 also includes a beam accelerator 13, which accelerates the beam from source 10, and directs it to target 12. Optionally, ion beam generator 11 also includes a filter for filtering ions ion the beam, e.g. based on the charge or mass of the ions. In some embodiments, accelerator 13 acts as a filter. For example, a cyclotron accelerator will naturally separate ions having different ionization states.

Beam accelerator 13 may be any suitable accelerator known in the art. In some embodiments, the accelerator system is a hybrid RFQ-DTL (Radio Frequency Quadrapole—Drift Tube LINAC) system available for modification from various vendors. Other accelerator systems such as almost any LINAC or cyclotron could be used.

A number of coupling methods can be used between ion source 10 and accelerator 13. For high intensity beams, a magnetic lens system is advantageous. For low intensity beams, an electrostatic lens system is more economic, compact, and effective. Generally, using a magnetic lens allows for an easy way to implement a particle filter that will reject any He$^+$ within the beam where the selected final ion state is He$^{++}$.

Figure 1A:
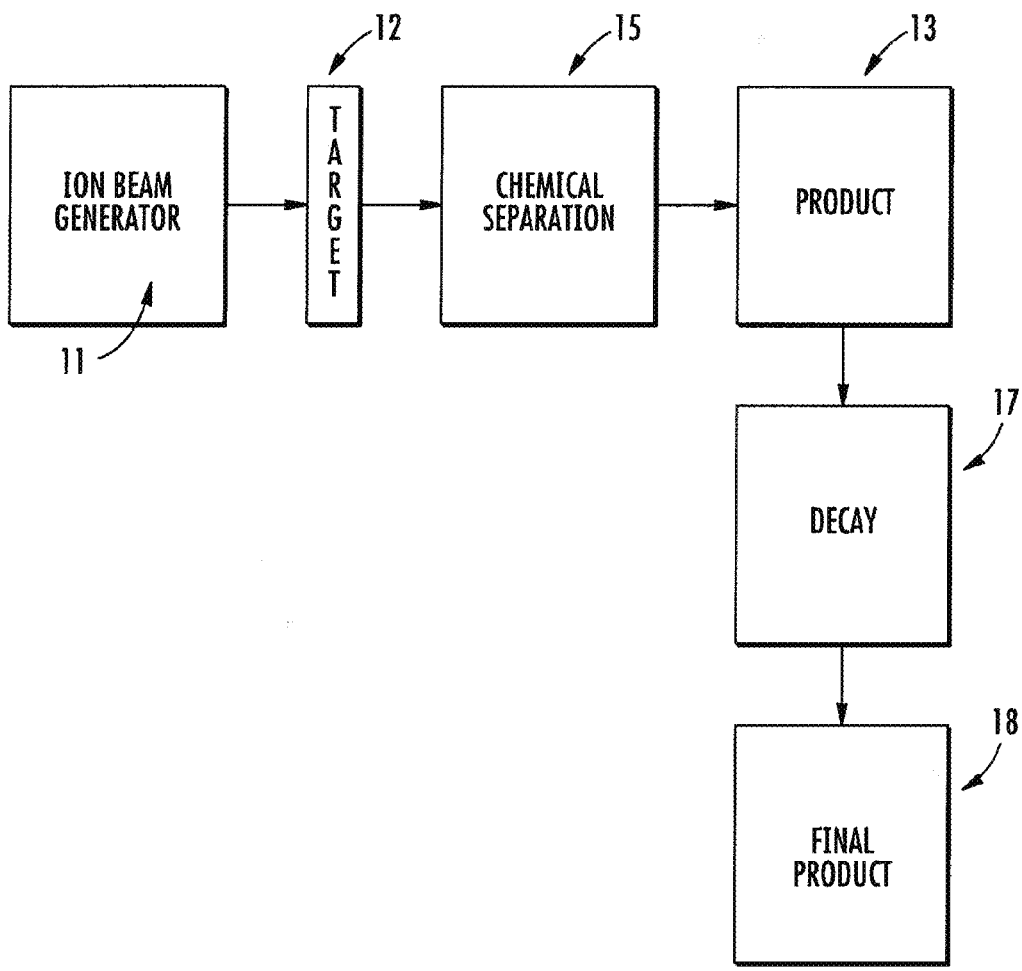
FIG. 1A is a block diagram of an ion beam system for making useful isotopes.

FIG. 1A shows a system 20 featuring ion beam generator 11. Ion beam generator 11 bombards target 12 with ions to transmute atoms in target 12 to produce a desired isotope. The transmuted target undergoes chemical separation 15 to provide a pure sample of product isotope 16. In some embodiments, product isotope 16 is an intermediate product, and undergoes decay 17 resulting in final product 18. In some embodiments, the intermediate product is a relatively long lived radio-isotope in comparison to the final product isotope. In some embodiments, final product 18 is an isotope suitable for use in medical treatment or diagnostic applications, research applications (e.g. radio-marking), energy generation applications (e.g. as nuclear fuel), etc.

Figure 1B:
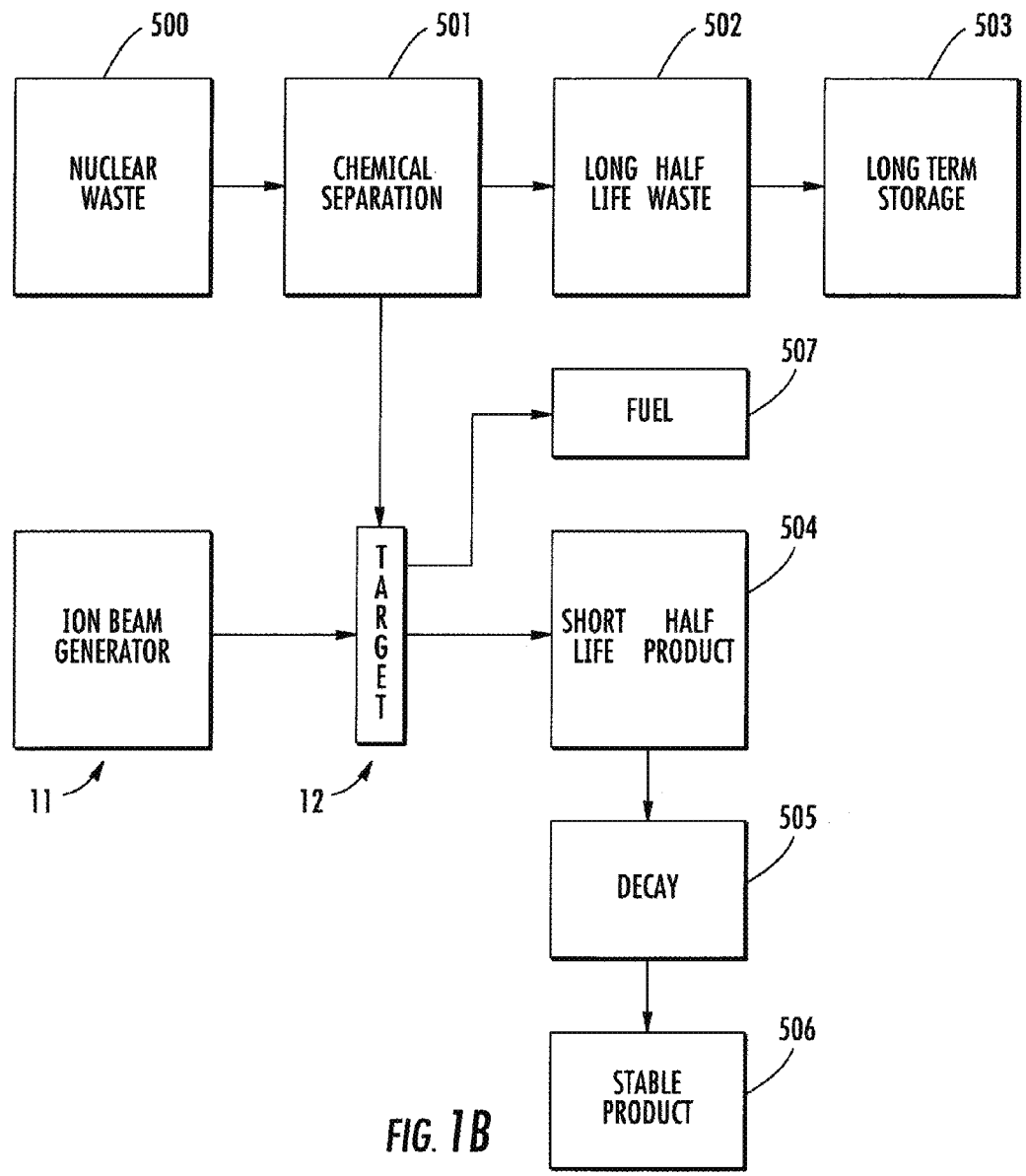
FIG. 1B is a block diagram of an ion beam system adapted for treatment of radio active waste from commercial nuclear power plants.

FIG. 1B shows a system 21 for treatment of nuclear waste 500. Nuclear waste (e.g. commercial nuclear waste from power generation, research, or medical use) undergoes chemical separation 501. Some long half life waste 502 not suitable for treatment is transferred to long term storage. Other waste is included in target 12, which is bombarded with ions from ion beam generator 11. In some embodiments, waste in target 12 is transmuted into a relatively short half life product 504 which undergoes decay 505 to become a stable product 506, which may be easily disposed of. In some embodiments, waste in target 12 is transmuted to usable fuel 507, and is thereby recycled.

Figure 1C:
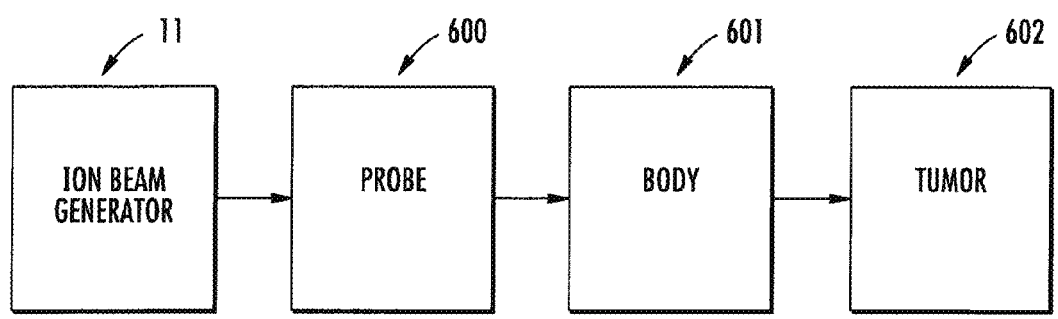
FIG. 1C is a block diagram of an ion beam system adapted for medical treatment, e.g. treatment of internal growths.

FIG. 1C shows a system for medical treatment. Ion beam generator 11 generates an ion beam which is directed by probe 600 to human or animal body 601 in order to treat tissue in the body. For example, in some embodiments, the ion beam is directed to a tumor 602 in body 601. Some embodiments include producing accelerated particles useful in treating interior tumors and the like wherein the particles (such as $H^+$, $He^{++}$, $C^{+4}$, $C^{+6}$, or $O^{+8}$) loose energy very slowly until at a certain energy state, substantially all of the particle's energy is transferred to the tumor.

FIGS. 2A, 2B, 2C, and 2D are operational diagrams of ion producing systems using Helium (He) ions as an example. In order to understand the operation of the devices described herein, it is helpful to understand the issues in generating multiple charged ions. Although the ionization of helium is discussed, the basic conclusions apply to all atoms, even including hydrogen (H) and deuterium ($^2$H) where a single electron is striped from the atom to produce a proton (p) or deuteron (d), respectively.

Figure 3A:
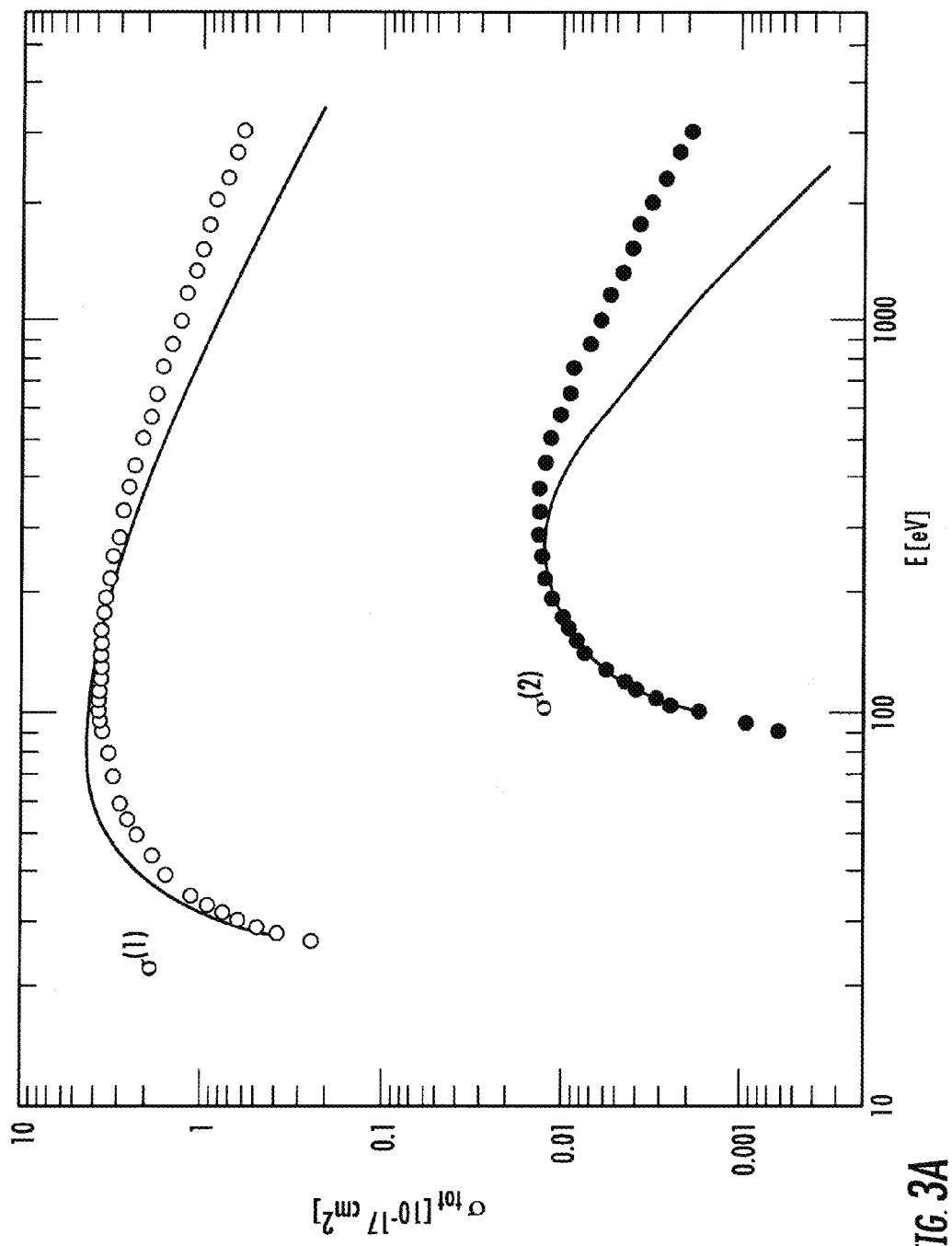
FIG. 3A is a graph of the cross-section for formation of He$^+$ and He$^{++}$ by electron impact on neutral He versus electron energy.

If an ion source uses electron impact to ionize neutral atoms, the ratio of charge states formed can be determined by the cross sections involved. In the case of helium, the cross section for production of $He^{++}$ is more than two orders of magnitude below the cross section for the production of $He^+$ (see FIG. 3A). In general, prior art ionization processes produce around 1% $He^{++}$ and 99% $He^+$.

Changing the electron impact energy does not make a significant change in the production of $He^{++}$. The best overall performance is obtained near the peak of the $He^{++}$ cross section, approximately 300 eV. Using saturation of states and some other known tricks, it is possible to generate a few percent $He^{++}$ with prior art devices.

Figure 3B:
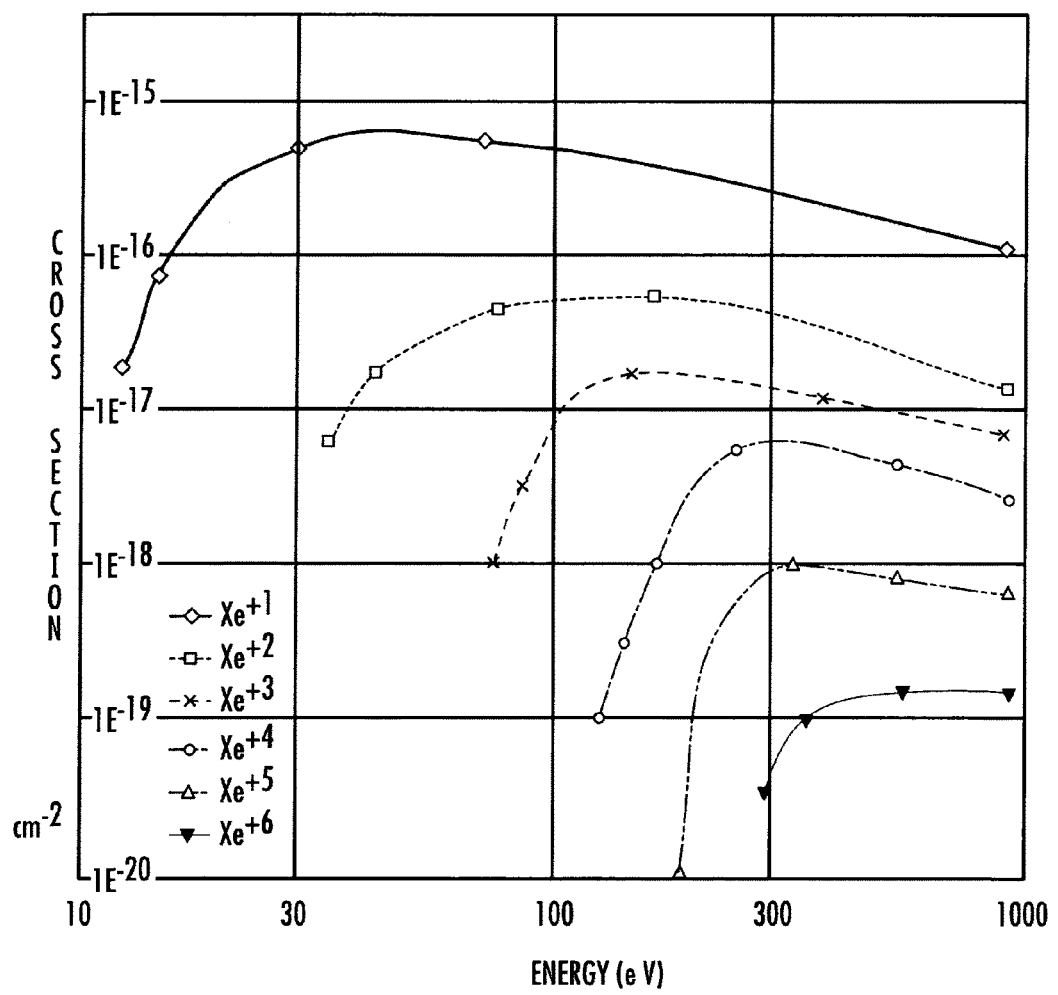
FIG. 3B is a graph of electron impact ionization cross-section for the first six ionization states of Xenon.

For generating highly ionized states of any other atom, the problem is made more difficult, by introducing more charge states, a greater variation in the cross sections, and more dependence of the cross sections on the electron energy. This can be seen in FIG. 3B, where the electron impact ionization for the first seven states of xenon (Xe) are shown.

Figure 3C:
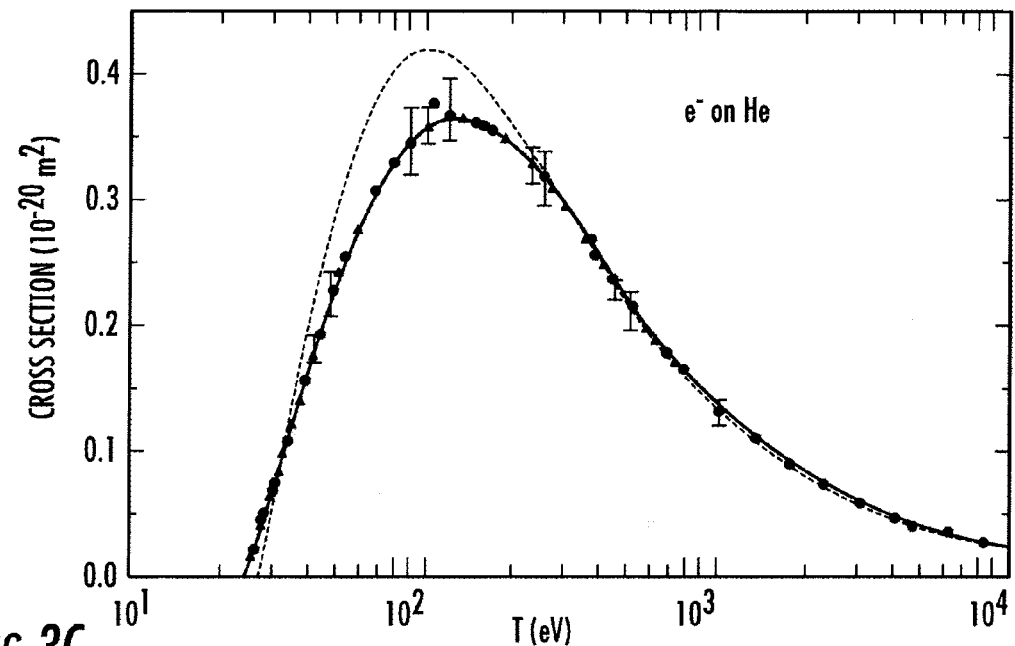
FIGS. 3C and 3D shows graphs of the cross-sections for electron impact ionization as a function of electron energy, of neutral He (He+e$^-$$\rightarrow$He$^+$2e$^-$) and He$^+$ (He$^+$+e$^-$$\rightarrow$He$^{++}$2e$^-$)
Figure 3D:
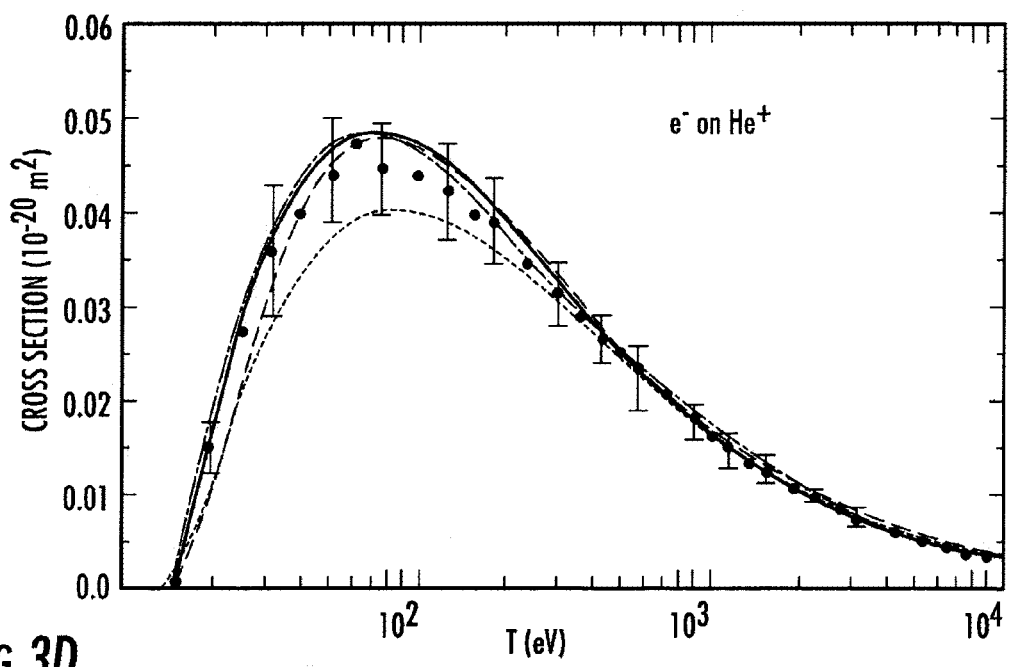

It is difficult to obtain $He^{++}$ with a single electron collision. If more then one electron collision is used, the fraction of $He^{++}$ can be increased greatly because the cross section for production of $He^{++}$ from $He^+$ is significantly higher than for the direct production of $He^{++}$ from neutral He (see FIGS. 3C and 3D).

Table I summarizes the different reactions for helium.

TABLE I

| | | |
|---|---|---|
| $He + e^- \rightarrow He^+ + 2e^-$ | $0.35 \times 10^{-16}$ | 120 |
| $He^+ + e^- \rightarrow He^{++} + 2e^-$ | $0.045 \times 10^{-16}$ | 200 |
| $He + e^- \rightarrow He^{++} + 3e^-$ | $0.001 \times 10^{-16}$ | 300 |

In order to ionize atoms by multiple collisions to reach a selected final ionization state, it is necessary to confine the intermediate states long enough for them to undergo additional electron collisions. In the case of helium, where $He^{++}$ is the selected final ionization state, it is necessary to confine the $He^+$ long enough for it to undergo a second ionizing collision to form $He^{++}$. In the case of other atoms, it is necessary to retain the ion long enough for it to undergo several ionizing collisions to reach the selected state of ionization.

The systems described herein use a confining magnetic field to retain the ions for the time required to reach the selected ionization state. In some embodiments, an azimuthally symmetric axial minimum magnetic field configuration is used. In other embodiments, a "true" minimum magnetic field configuration is used. For production of many ion charge states (e.g. $He^{++}$) the simpler axial minimum field configuration seems to be adequate. For production of highly charged states of some atoms, a "true" minimum magnetic field may be necessary.

Figure 2A:
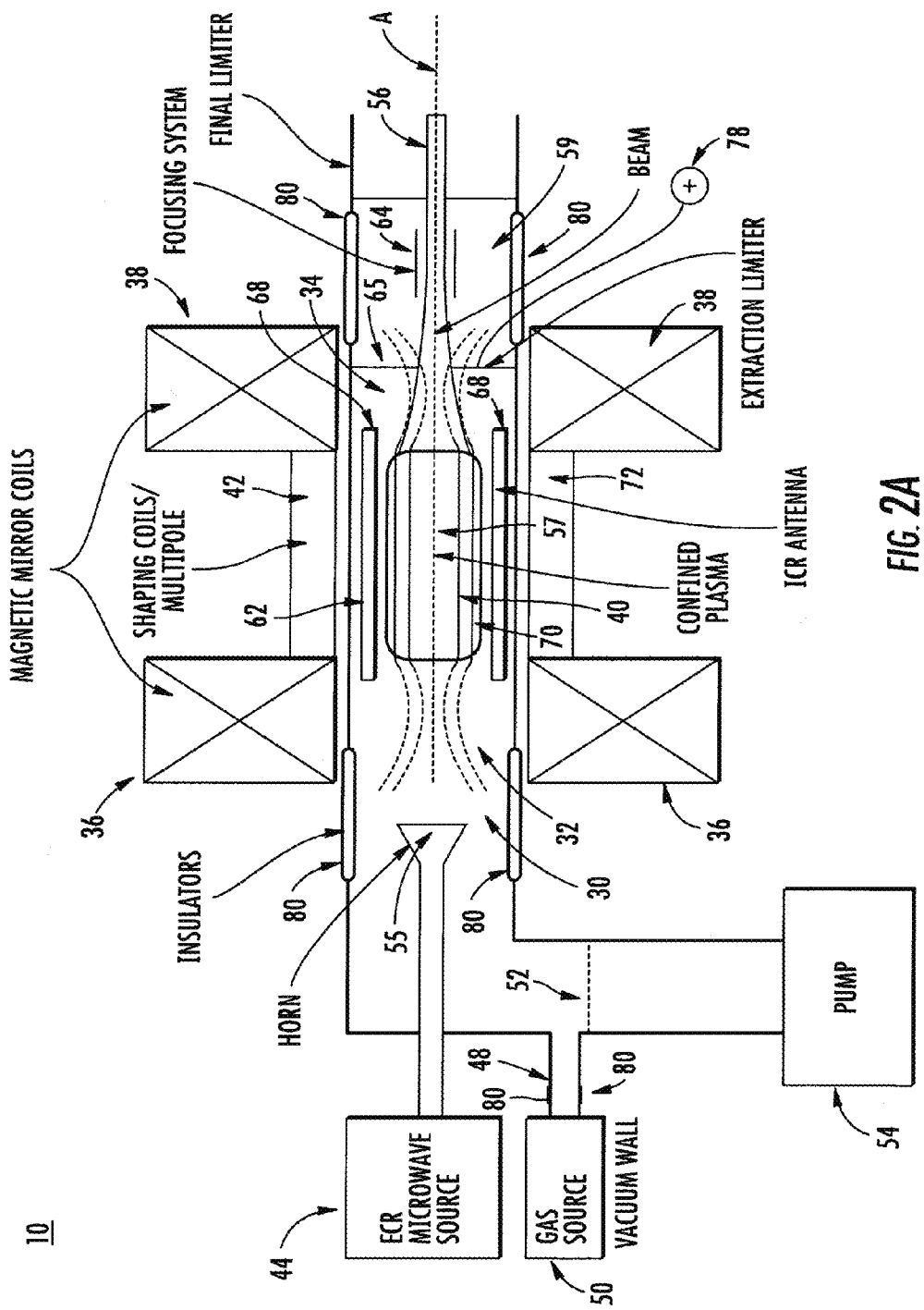
FIG. 2A is an operational schematic of an ion beam system
Figure 4:
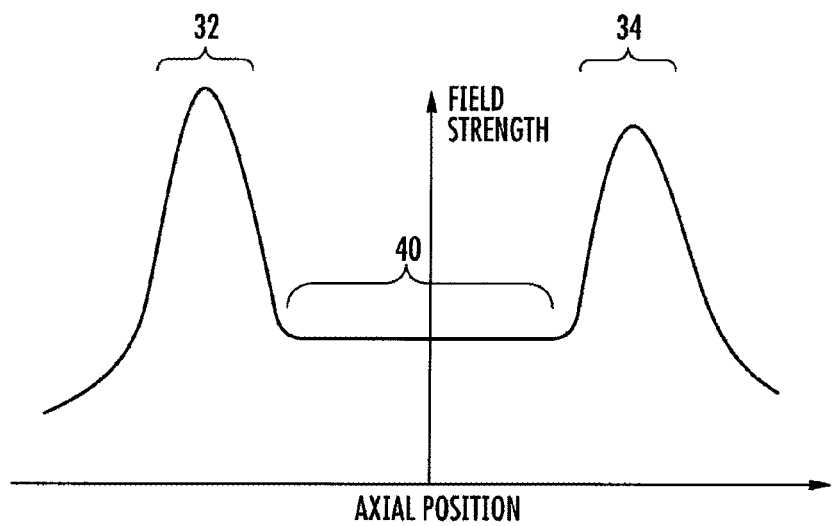
FIG. 4 is a graph of magnetic field magnitude as a function of axial position in an ion source.

FIG. 2A shows an exemplary ion source 10. Ionization chamber 30 is arranged along longitudinal axis A. Within the ionization chamber 30, a local axial minimum magnetic field is formed between two magnetic mirror fields 32 and 34 (field lines indicated with dashed lines), preferably generated by superconducting magnets 36 and 38. The local axial minimum field is formed as central region of lower, substantially uniform magnetic field 40, (field lines indicated with dashed lines). FIG. 4 shows a plot of the magnitude of the fields 32, 34, and 40 as a function of position along axis A for an exemplary field configuration.

As will be described in detail below, uniform field region 40 provides several beneficial effects which allow for the efficient production of intense ion beams of ions in a selected, multiply ionized state. In embodiments featuring axial minimum configurations, mirror fields 32, 34 and central field 40 may each be azimuthally symmetric about axis A.

Referring back to FIG. 2A, although superconducting magnets are used in some embodiments, they are not required for production of the mirror fields 32 and 34 in every instance. In some embodiments, the coils of superconducting magnets are easier to adjust as the diameter of the wire can be smaller, leaving more room for field adjustment. Refrigeration systems, not shown, for superconducting magnets are commercially available.

The central magnetic field 40 can be implemented using a central magnet 42, which may include copper coils, superconducting coils, and/or fixed magnets. Magnet 42 may include a multi-pole magnet is used to generate a "true" minimum field configuration (as described below). In some embodiments, this may be implemented using fixed magnets, although electromagnets or other magnets could be used. A superconducting central magnet 42 is convenient when superconducting magnets 36 and 38 are used, since the area must be cooled close to absolute zero.

Exciter system 44 excites the electron cyclotron resonance of electrons in chamber 40. In some embodiments, to produce ECR excitation, the exciter system 44 introduces microwave energy into the ionization chamber 30 directly. In typical embodiments the center field magnetic region 40 between the two magnetic mirror fields 32 and 34 is substantially uniform (constant magnetic field) although a non-uniform magnetic field will operate. Preferably, the rear part 47 of the ionization chamber 30 includes a connection 48 to a gas source 50, when a gas to be ionized is introduced into the system. In other embodiments, the gas can be introduced anywhere a convenient connection can be made. A perforated plate 52 separates the chamber 30 from a vacuum pump 54 to maintain a slight gas pressure within the chamber 30 and produce a beam 56 of the desired ions from the plasma 57 confined between mirror fields 32 and 34.

The ECR exciter system 44 provides an electric field that couples to the electron cyclotron motion of electrons in chamber 30. Since the electron cyclotron frequency is generally high, the ECR drive tends to be in the microwave frequencies. For these frequencies, wave guides provide the most efficient coupling. ECR coupling, however, is not limited to wave guides, and can be accomplished in other ways, such as cavity mode excitation, optical drive, etc.

If a gyrotron, or other circular wave guide device, is used as an ECR source, good performance will typically be obtained when the rotation direction of the wave within the wave guide is matched to the rotation direction of the electrons in the magnetic field 40. The position of the ECR drive output 55 and gas feed 48 can be optimized so that plasma is primarily produced between the two magnetic mirror fields 32 and 34. In some embodiments, this increases the overall efficiency and minimizes the plasma production in the rear part 47 of the chamber 30, which can simplify the microwave feed system.

The frequency and power in the ECR drive system 44 are related to the plasma density produced. Higher frequency and power both typically correspond to a higher plasma density. The optimal power and type of ECR source may be adjusted for each type of ion.

The substantially uniform central magnetic field 40 between the two magnetic mirrors 32 and 34 will operate for a wide range of lengths. The optimal length may be readily determined experimentally for each ion, selected final ionization state, beam intensity, beam pulse length, and ECR power. Increasing the length of the central magnetic region 40 increases the region over which hot electrons are confined, and thus increases the potential for ionizing collisions. Making this region larger increases the ionization, but at the expense of increasing the time it takes to form a stable plasma. Optimally, a pair of superconducting magnets 36 and 38 are used. Such magnets may not allow for significant variations in the length of the magnetic field 40, because they are not easily relocated. For production of $He^{++}$, this is typically not an issue. But for production of other highly charged ions, more easily movable magnets may be used to allow adjustment the magnetic fields.

In some embodiments, the central magnetic field 40 is chosen to match the ECR frequency of the microwave source 44. The exact values of the mirror fields 32 and 34 are not critical to the operation of the system 10, but may have a large impact on system efficiency. In some embodiments the rear mirror field 32 is higher then the front mirror field 34 (e.g. as shown in FIG. 4). A beam may be formed by allowing ions to leak out of the mirror fields 32 and 34. By making the rear mirror field 32 higher than the front mirror field 34, most of the ion losses, which form the multiply ionized particle beam 56, are through the front mirror field 34. In other embodiments, mirror fields 32 and 34 may be of equal or substantially equal strength.

The exact value of the front magnetic mirror field 34 can be chosen from a wide range of values, and is generally close to a value of twice the central field 40. In other embodiments it may be three, four, five, or more times that of the central field. Using a higher value of the front field 34 increases the confinement of the ions and electrons, but can cause instabilities in the flow of the plasma 57. Using a lower value field decreases the fraction of ions trapped between the mirror fields 32 and 34. The optimum value depends on the ion, charge state, gas pressure, beam intensity, and ECR power. The exact values may be determined experimentally in each instance.

In order to understand the operation of the system 10, it is helpful to understand how a magnetic mirror 32 or 34 works. Magnetic mirroring occurs when a charged particle moves from a region of low magnetic field to a region of high magnetic field. The magnetic moment of the particle is an adiabatic invariant of the motion:

$$\mu \equiv \frac{mv_\perp^2}{2B}$$

An adiabatic invariant remains invariant so long as the rate of change of the parameters is "slow". "Slow", means that the magnetic field and the perpendicular velocity change slowly over one cyclotron period. In typical embodiments of the magnetic mirrors described herein, this is generally an excellent approximation, except possibly during extraction of the beam 56. The invariance of the magnetic moment indicates that if the particle moves from a region of small magnetic field to a region of large magnetic field, the perpendicular velocity must increase. By conservation of energy, this means that the parallel velocity must decrease. Thus, if a particle with a given perpendicular velocity moves from a region of low magnetic field to a region of sufficiently high magnetic field, the parallel (axial) velocity will go to zero, thereby stopping the particle. As is familiar to those skilled in the art, a more through analysis of the particle dynamics shows that, in fact the particle will be reflected.

By combining the magnetic moment invariant with the conservation of energy, $$E = \frac{1}{2}mv_\perp^2 + \frac{1}{2}mv_\parallel^2$$

a simple set of equations governing the flow of a particle from magnetic field $B_1$ to magnetic field $B_2$ can be derived:

$$v_{\perp 2}^2 = v_{\perp 1}^2 \frac{B_2}{B_1}$$

$$v_{\parallel 2}^2 = v_{\parallel 1}^2 + v_{\perp 1}^2 \left(1 - \frac{B_2}{B_1}\right)$$

Figure 5:
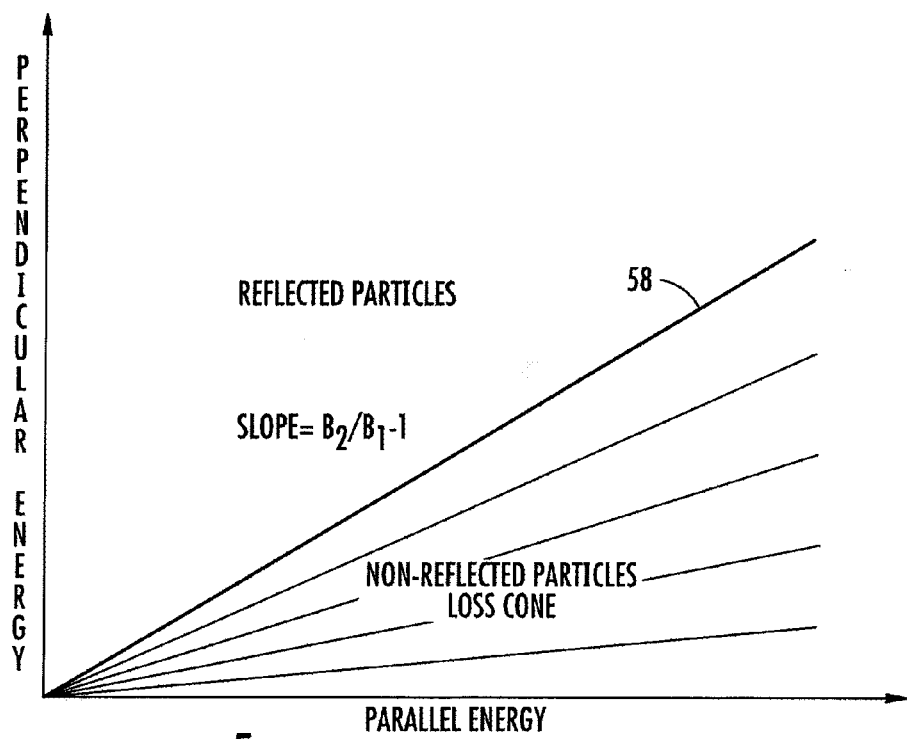
FIG. 5 is a graphical view of the loss cone associated with the magnetic fields of FIG. 4.

When a particle travels from a low magnetic field to a high magnetic field, the second term in the parallel velocity equation can be negative. If it is sufficiently negative the particle will stop and be reflected. Therefore, if particles are moving from one magnetic field to another, the reflection depends on the ratio of the perpendicular to parallel velocity of the particle. Specifically, the particle will be reflected at some point when:

$$\frac{v_{\parallel 1}^2}{v_{\perp 1}^2} < \left(\frac{B_2}{B_1} - 1\right)$$

the non-reflected particles can be visualized as a cone 58 in velocity space, as shown in FIG. 5.

Generally magnetic mirrors fields, such as magnetic mirror fields 32 and 34 leak. Particles in the loss cone 58 leak out of the front mirror field 34 (or the back mirror field 32). Particles that are not in the loss cone 58 are eventually scattered into the loss cone 58. The systems described herein, in various embodiments, rely on this scattering to move the particles into the loss cone 58 that will then pass through the front magnetic mirror field 34 and form a source of ions.

Referring back to FIG. 2A, during source operation microwaves are used to excite the ECR in the central region 40 in chamber 30 of the source. This generates hot electrons that ionize the background gas. For $He^{++}$ production, the preferred electron energy is around 200-300 eV. For other atoms, the preferred electron energy may easily be experimentally determined by the energy required to produce the desired charge state and/or the peak of the cross sections involved.

Considering first the production of alpha particles ($He^{++}$) the hot electrons generate mostly $He^+$ and some small amount of $He^{++}$. Some of the generated $He^+$ is trapped between the magnetic mirror fields 32 and 34 and undergoes a second collision forming $He^{++}$. Gradually, the $He^{++}$ and $He^+$ are scattered into the loss cone 58 where they leak out, primarily through the front mirror field 34, forming the beam 56 of $He^+$ and $He^{++}$. Generally the description focuses around alpha particles ($^4He^{++}$), but the same discussions apply equally to helium-3 ions ($^3He^{++}$) or other doubly ionized ions.

The plasma beam 56 of $He^+$ and $He^{++}$ in a ratio (determined as the ratio of the beam current of $He^{++}$ to total beam current) of up to 84% $He^{++}$ or more leaking from the front mirror field 34 is producible using an ECR system 44 only, is accelerated by a extractor 59 which may include a sequence of electrodes and focusing elements to form the particle beam 56. In cases where it is desirable to transmit the beam 56 to a magnetic field free region, the extraction system can be designed to make sure that particles remain adiabatic until the particles are out of the magnetic field 34.

If the plasma flow out of the magnetic field zone remains adiabatic, the mirror relations can be applied. As the particles travel from the high magnetic field to the low magnetic field, perpendicular energy is converted to axial (parallel) energy. This keeps the emittance of the beam 56 low during the particle extraction. A non-adiabatic extraction of the beam 56 results in perpendicular energy of the beam 56 being retained and the extracted beam 56 has larger emittance.

There are four known major sources of particle losses in the plasma system 60 of the present invention. These are: recombination, charge exchange, radial diffusion, and loss cone scattering (axial diffusion).

In typical embodiments, Recombination is not a significant effect. Generally, the electrons in the plasma system 57 are at a very high energy. As a new electron is liberated in an ionizing collision, it rapidly gains energy. Therefore, recombination between the energetic electrons and the ions is not significant.

Charge exchange affects only the multiply charged ions. If an electron is transferred from He to $He^+$, the result is the same number and composition of ions, that is, the He becomes $He^+$ and the $He^+$ becomes He. If an electron is transferred from He to $He^{++}$, however, the result is two $He^+$ ions, so a $He^{++}$ ion was lost. In the case of the devices described herein, the ion energy can be sufficiently low that charge exchange is not a significant problem.

Radial diffusion is not an issue if the central magnetic field 40 is large. If the cyclotron orbit of an ion is small compared with the size of the ionization chamber 30, radial diffusion is very slow and particles are scattered into the loss cone 58 faster than they diffuse radially.

In typical embodiments, scattering into the loss cone 58 is the primary loss method for particles. The system 10 requires this scattering process in order to generate the beam 56 from the plasma 57. Loss cone scattering of $He^{++}$ is desirable as this forms the extracted ion beam 56. Loss cone scattering of $He^+$, however, is not desirable as it causes $He^+$ to enter the beam 56, thus increasing the percentage amount of $He^+$ in the beam 56. $He^+$ ions in the beam 56 can be separated from the $He^{++}$ ions using a mass ion filter 61, but this decreases the beam intensity, increases the emittance, and decreases the overall beam efficiency.

The hot electrons generated by the ECR source 44 have a non-isotropic distribution, with the perpendicular energy being much larger then the axial energy. Ions generated by the collisions with the electrons also have a non-isotropic distribution with more of the energy perpendicular to the magnetic field 40 than parallel. Given a mirror ratio near 2 ($B_{mirror}/B_{central}$), somewhat more than half the formed $He^+$ is confined by the mirror fields 32 and 34, and somewhat less than half the $He^+$ is not confined and leaves the mirror fields 32 and 34 on the first pass. Some of the initially unconfined particles exit from the rear mirror field 32 and the rest exit from the front mirror field 34. Depending on the particle densities and temperatures, geometric considerations, and some other parameters, the produced beam 56 will typically be between 50-90% $He^{++}$ and 50-10% $He^+$. The exact ratio of $He^+$ to $He^{++}$ in the generated beam 59 depends on a complicated set of relations between gas density, ECR power, source geometry, and magnetic field geometry. The exact ratio can be determined experimentally and optimized to produce a desired beam ratio 56. As noted above, beam ratios of 84% or greater have been experimentally demonstrated using devices of the types described herein.

The ratio of highly multiply ionized particles can be increased by using an ICR (Ion Cyclotron Resonance) exciter system 62, although for $He^{++}$, it may not be needed. This system 62 uses antennae 68 in the chamber 30 between the mirror fields 32 and 34 to emit at the radiation proper frequency to couple energy into the ion cyclotron resonance of $He^+$ ions, thus coupling energy into the perpendicular motion of the $He^+$ ions. In general, the axial (parallel) velocity of the particles remains unchanged by ICR excitation. Increasing the perpendicular energy pushes the driven particles out of the loss cone 58. In some embodiments, by using ICR excitation, the scattering rate of $He^+$ into the loss cone 58 can be reduced to nearly zero.

In reality, the $He^+$ ions cannot be kept out of the loss cone 58 indefinitely. Given sufficient time, particles will be scattered into the loss cone 58. This scattering basically is converting some of the particle's perpendicular energy into parallel energy. The ICR excitation can then add more perpendicular velocity and push the particle back out of the loss cone 58 again, but eventually, the parallel energy will get sufficiently high that the particle will escape the mirror fields 32 and 34.

The goal is not to keep ions out of the loss cone 58 indefinitely, but rather just long enough to undergo a multiple ionizing collisions. When the system 10 is operated at a high plasma density, these multiple ionizing collisions occur faster than scattering into the loss cone 58.

When the ICR excitation is used, the system 10 operates as follows. Microwaves excite the ECR in the central magnetic region 40 of the chamber 30, which generates hot electrons. These electrons ionize the background helium gas producing mostly He$^+$ ions, but also some He$^{++}$ ions. The ICR system 62 excites the He$^+$ resonance in the central magnetic region 40. The He$^+$ ions are trapped between the two magnetic mirror fields 32 and 34 where a second collision with an electron causes a second ionization to produce He$^{++}$. The ICR excitation does not couple to the He$^{++}$ ions, which have twice the cyclotron frequency. The He$^{++}$ ions are scattered into the loss cone 58 where they exit the chamber 30 as the ion beam 56. In some embodiments, most of the He$^{++}$ exits via the front mirror field 34, which is lower. In some embodiments, the height of the back mirror field 32 should be as high as possible, or at least higher than the front mirror field 34. However, system 10 may operate even when front mirror field 32 is equal to or substantially equal to back mirror field 34

In some embodiments, the ICR excitation causes the density of the plasma to increase until losses balance production. In the limit, where the ICR exciter 62 can hold the He$^+$ out of the loss cone 58 indefinitely, the plasma density will increase until the production of He$^+$ is equal to production of He$^{++}$, which equals the rate that He$^{++}$ is scattered into the loss cone 58.

Most of the above examples have focused on helium. Helium has only two charge states so it is easy to see how system 10 can produce a high density ion beam 56 of He$^{++}$. The same technique can also be used to produce multiply ionized ions in a selected final ionization state of almost any other atom, especially when the ICR system 62 is used. However, when working with other atoms (e.g. those with more than two ionization states), several issues are notable.

First, depending on the ionization state and the atom required, it may be necessary to increase the electron energy of the ECR heated electrons. This can be done by increasing the power in the ECR source 44 and/or by decreasing the cooling effects on the electrons. Under the correct conditions one may obtain electron energies as high as 600 to 1000 keV. In order to obtain very high electron temperatures, it may be necessary or desirable to add a radially confining multipole field to the center region 70 of the magnet system, creating a "true" minimum magnetic field configuration. In some embodiments, a radially confining multipole magnet 72 (e.g. a hexapole, or higher order multipole magnet) may be used. This may have some real advantages if an ICR exciter system 62 is used. As described in more detail below, the higher order multipole magnet 72 localizes the field effects to the outer radial edge of the plasma 57 and leaves the central part of the plasma 57 (located proximal to axis A) unaffected. The "true" minimum magnetic field configuration provides a form of insulation between the plasma 57 and the wall 76 of the chamber 30 and makes it easier to obtain high temperature electrons.

Second, if the ICR exciter system 62 is used, there is a question of what ICR frequency to use. When there are several ionization charge states available, so there will be several potential ICR exciter frequencies:

$$\frac{1eB}{M}, \frac{2eB}{M}, \frac{3eB}{M}, \frac{4eB}{M}, \ldots$$

In some embodiments, one frequency is chosen for excitation. Generally, exciting the lowest ionization state provides the most increase in production of any higher states. It is also possible to excite multiple states, or all states. For example if the desire was to produce O$^{+8}$, useful in treating inoperable tumors, an ICR excitation system could be provided with multiple antennae that excite the ICR resonances of O$^+$, O$^{++}$, O$^{+3}$, O$^{+4}$, O$^{+5}$, O$^{+6}$, and O$^{+7}$, thus preferentially holding all oxygen ions other than O$^{+8}$ within the chamber 30.

The system 10 includes a positive source 78 to bias the chamber 30 at high potential in order to accelerate the ions extracted. Therefore a number of insulators 80 are necessary to allow the system 20 to be biased at different voltages and to electrically isolate the chamber 30 to provide operator safety.

Figure 2B:
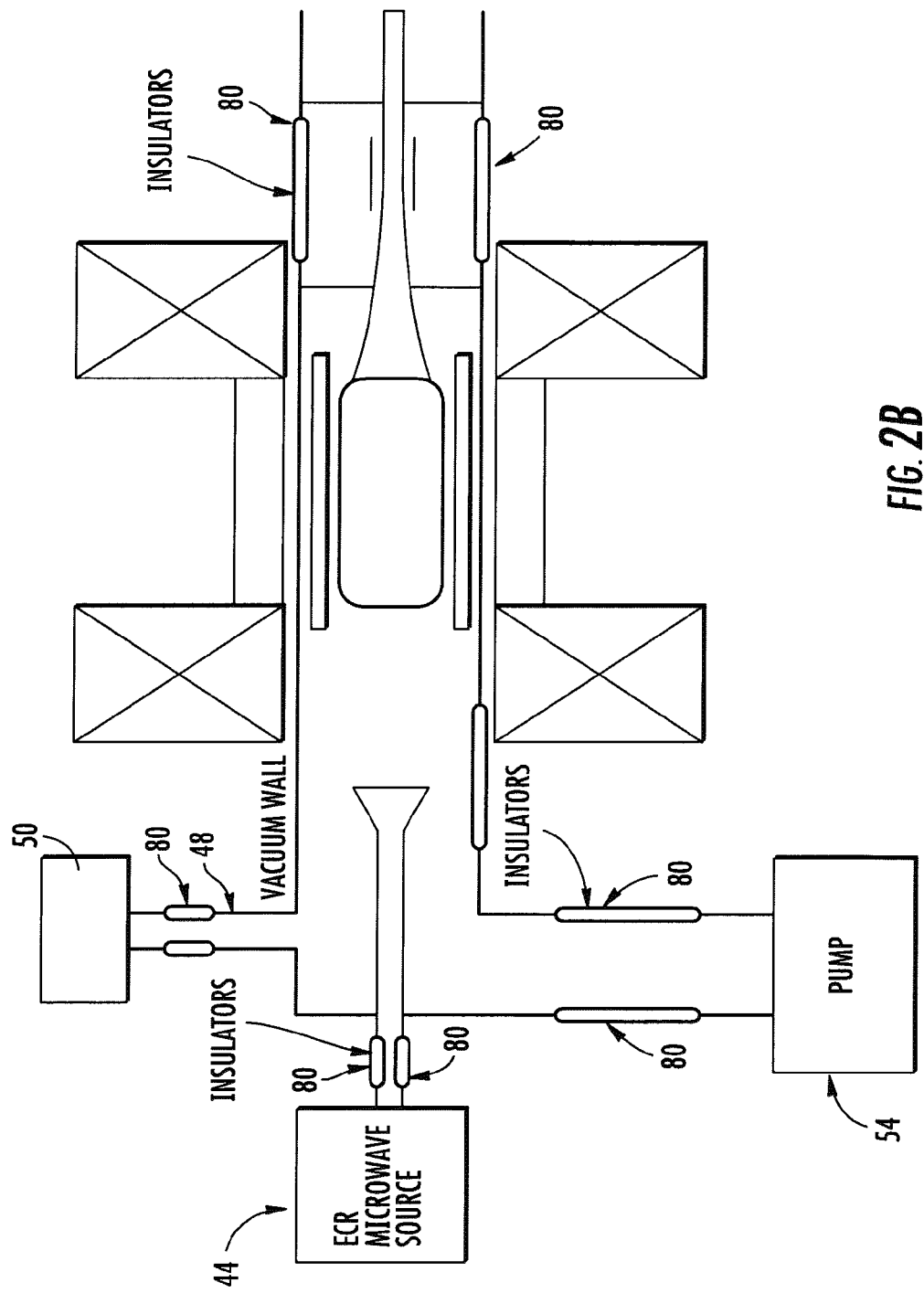
FIG. 2B is an operational schematic of an ion beam system showing modified insulators.
Figure 2C:
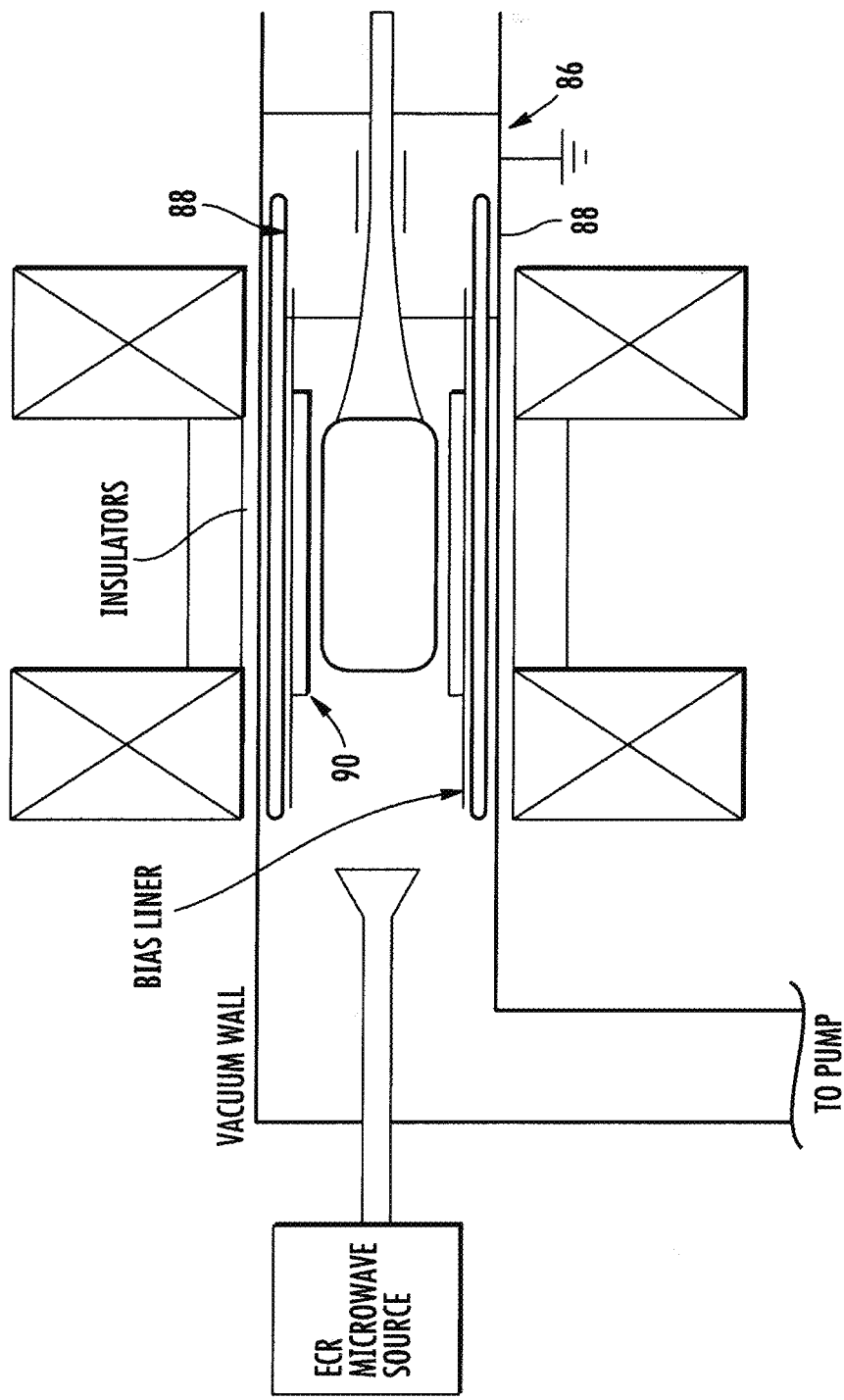
FIG. 2C is an operational schematic of an ion beam system showing a grounded chamber.

There are a number of different ways to implement insulator systems. These include, but are not limited to the embodiments of system 10 shown in of FIGS. 2A, 2B, 2C, and 2D. The configurations shown in FIGS. 2A and 2B are just variations of each other with insulators 80 used to electrically isolate the vacuum pump 54, the ECR source 44 and the atom source 50. The system shown in FIG. 2C is significantly different in that the entire outer wall 86 of the chamber 30 is biased at ground. An internal bias liner 88 is used to control the plasma bias and thus the extraction energy of the ions. In terms of fabrication, in some embodiments this may be somewhat more complicated, but may provide greater operator safety in that it is more difficult for an operator to come in contact with the high voltage. With an inner bias liner 88, the liner 88 could be placed either inside or outside of the ICR antenna 90. In some cases, it may be possible to use the ICR antenna 90 itself as a bias liner 88, but if the bias liner 88 is placed inside the ICR antenna 90, it must contain at least one slit to prevent shorting out the ICR drive.

Figure 2D:
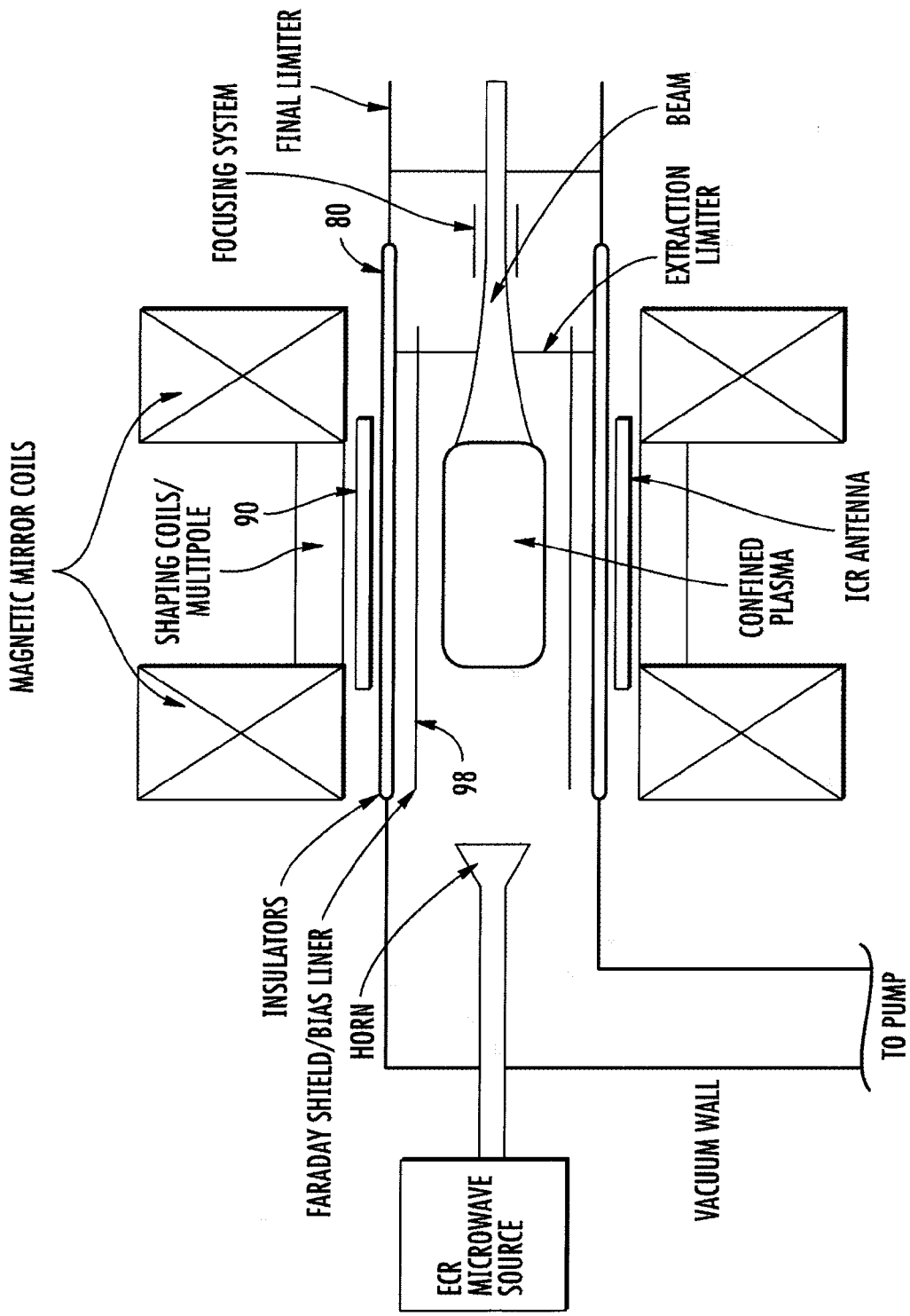
FIG. 2D is an operational schematic of an ion beam system showing external ICR antenna.

FIG. 2D shows a variation of system 10 using a non-conducting vacuum wall 80 where the ICR antenna 90 external to the vacuum system. A Faraday shield 98 is used as a bias liner inside the vacuum system.

An external antenna design can be generalized to work with most antennas. In most cases an insulating chamber wall can be used. The antenna system can be located external to the vacuum system. A bias liner containing slit(s) can be used inside the chamber to control the plasma bias without interfering with the ICR excitation.

As shown in FIGS. 6A and 6B, an ICR exciter system 62 includes an RF drive system 96, an antenna 90, and a tuning system 100. The goal is to generate an electric field that will couple to the ion cyclotron motion. An electric field rotating in the same direction as the ions provides the highest coupling, but other combinations such as linear or radial electric fields also work. Generally the ICR frequencies are in the RF range and the antenna 90 is fed from coaxial lines 102. A capacitor/inductor network normally is used within the tuning system 100 to match the antenna 90 with the driver system 96. In typical embodiments, the magnetic field in the region where the ICR exciter is applied should be relatively constant so that the cyclotron frequency of the ions is well defined. Central uniform field region 40 meets this requirement. Depending on how the antenna 90 is implemented and how the insulator system is implemented, the antenna 90 may be at high voltage. Coupling between the antenna 90 and RF drive system 96 can be provided using a transformer or capacitors in order to provide isolation between the systems.

A number of different antenna systems such as antennae 90, can be used for the ICR exciter 62 These include, but are not limited to: cavity excitation, capacitor plates, split-ring, and filer. Cavity excitation simply couples to the cavity mode of the chamber 30 using a loop (not shown) or some other type of exciter.

The optimal antenna design may depend strongly on the specific ion and charge state desired. For production of multiply charged ions other than doubly charged ones, it may be desirable to drive the antennae at multiple frequencies.

Capacitor plate antennas can be either linear (FIG. 6A) or circular drive (FIG. 6B). In the case of linear drive the two plates 104 and 106 are driven to generate an oscillating electric field. In the case of a circular drive, vertical plates 108 and 110 are driven 90° out of phase with the horizontal plates 104 and 106, generating a rotating electric field. In other embodiments, other phase angles may be used, thereby generating elliptical drive radiation. Note also that although the terms vertical and horizontal are used here for convenience to describe the relative positioning of the plates, the antenna plates may be oriented arbitrarily in chamber 30. The exact structure of the plates is unimportant, other than that they provide an electric field perpendicular to the magnetic field 40. In some embodiments, capacitor plate antenna (or other antenna type) may be used in exciter system 62 to produce output at multiple frequencies Referring to FIG. 7, a split-ring antenna 111 consists of a coil of wire (or tubing to allow cooling) 112 wrapped around a Faraday shield 114. The Faraday shield 114 prevents the helical electric field of the coil 112 from reaching the plasma 57. The lengthwise slit 116 in the metal of the Faraday shield 114 allows a mostly linear component of the electric field to reach the plasma 57, which couples to the ion cyclotron resonance. The actual electric field is more like radial arcs coming from the slit 116, but this couples to ion motion with about the same efficiency as a linear drive system.

In cases where an internal bias liner is used, e.g. as shown in FIG. 2C, it is possible to use the Faraday shield 114 as a bias liner inside the ICR exciter system 62. A variation of this arrangement, as shown in FIG. 2D, is to use a non-conducting vacuum wall insulator 80 and place the ICR antenna external to the chamber 30, and use the Faraday shield 98 as a bias liner inside the chamber 30.

An external antenna design can be generalized to work in most configurations. In most cases, the chamber 30 can include an insulating chamber wall 80 so that the ICR antenna 68 can be located in a region of ambient pressure, outside of the chamber 30. A bias liner 98 containing one or more slits 116 (as shown in FIG. 7) can be used inside the chamber 30 to control the plasma bias without interfering with the ICR excitation.

Figure 8:
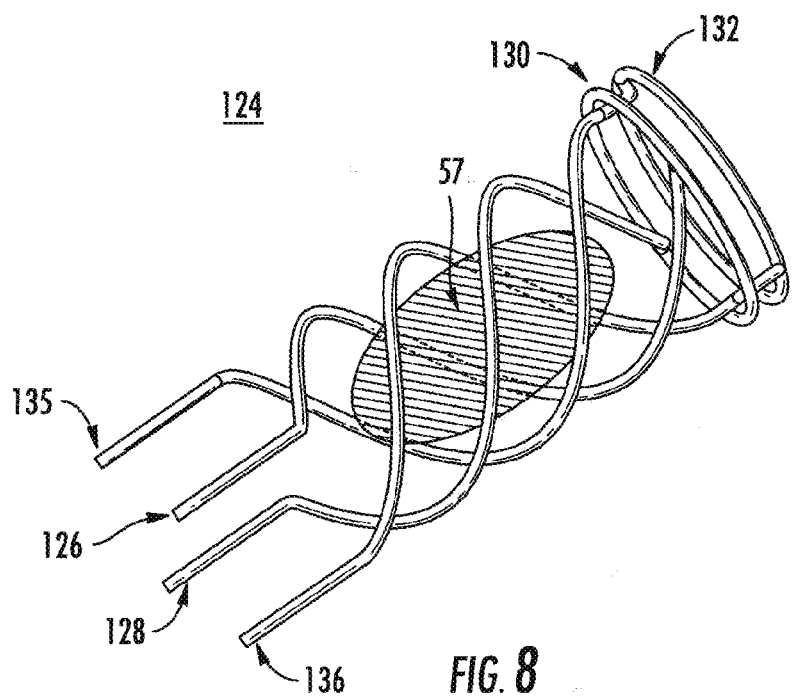
FIG. 8 is schematic diagram of a bi-filer antenna where the to coils are driven 90° out of phase to generate a rotating electric field for the ICR.
Figure 9:
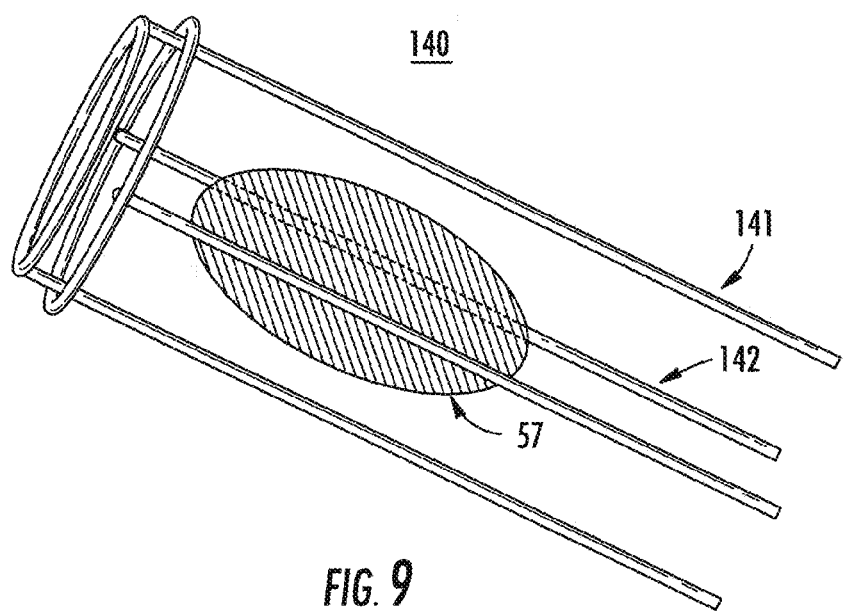
FIG. 9 is schematic diagram of an untwisted bi-filer antenna where the two coils are driven 90° out of phase to generate a rotating electric field for the ICR.

Referring to FIG. 8, a filer antenna 124 contains a number of helical conductors, 126 and 128 shown, in which currents are driven. Depending on the type of filer, either a linear drive field or a rotating (i.e. circular or elliptical) drive field is generated. For a rotating drive field, as shown, there are actually two filers 130 and 132 that are constructed perpendicular to each other having helical conductors 126 and 128, and 135 and 136. The two filers are driven 90° out of phase to generate a rotating electric field. A simple filer antenna would have only one of the two filers 130 or 132.

In addition to the other variations in the ICR antenna systems 60 discussed above (cavity excitation, capacitor plates, split-ring, and filer) an untwisted filer antenna 140 can be used. As shown, untwisted filer antenna includes two filers 141 and 142. In some embodiments a singe untwisted filer may be used. In this case, one of filers 141 and 142 would be omitted.

The bi-filer antenna 124 is basically a twisted set of current carrying wires. The wires on opposite sides of the plasma 57 carry current in opposite directions. These wires combine to generate a magnetic field in the center of the plasma 57. As the current oscillates, the generated magnetic field oscillates, and induces an electric field in the center of the plasma 57. A single filer antenna generates a linearly polarized excitation and the bi-filer antenna typically generates a rotating excitation field (circularly or elliptically polarized). Generally inductive antenna systems (such as the filers) have advantages over electrostatic antennas (such as capacitor plates). This is because the high density plasma 57 tends to screen out the electric field generated by electrostatic antennas, thus such antennae primarily couple to the plasma 57 only at the outer edge of the plasma 57. Inductive antennae drive though an induced electric field that is generated by an oscillating magnetic field. The magnetic field can pass through the plasma 57 and thus the drive field is located everywhere in the plasma 57, and generally is peaked on the axis of the chamber 30.

Typically a filer antenna 124 has a twist in it to prevent charge separation in the plasma 57. In the present invention, the twist is not needed. The short length of the source allows the particles at the end of the plasma 57, where the drive field is weak, to provide neutralization, thus charge separation is not a large problem. Further neutralization is provided by plasma rotation, which prevents the antenna, such as bi-filer 124, from driving only over one part of the plasma 57. The plasma rotation is due to the slight non-uniformity of the plasma 57 as ions and electrons are lost at slightly different rates, resulting in a slight charge imbalance that equalizes these two loss rates (ambipolar potential). This charge imbalance gives rise to a radial electric field, which combined with the axial magnetic field gives rise to plasma rotation.

The untwisted-filer antenna 140 has advantages that it will couple to the ions going both directions in the source. The twisted-filter antenna imposes a Doppler shift on the ICR drive field. This means the drive field couples to particles with a cyclotron frequency given by $\omega \pm k_z v_z$ (where the sign is determined by the direction of the antenna twist relative to the direction of ion cyclotron rotation, and $k_z$ is determined by the structure of the filer). The twisted-filer can be matched to particles going one direction in the device (say positive-z), but not the other direction, since the sign of the axial velocity will change. The untwisted-filer has $k_z=0$, thus it will couple to particles going both directions in the device. This allows the ICR exciter to couple to more of the plasma.

Figure 10A:
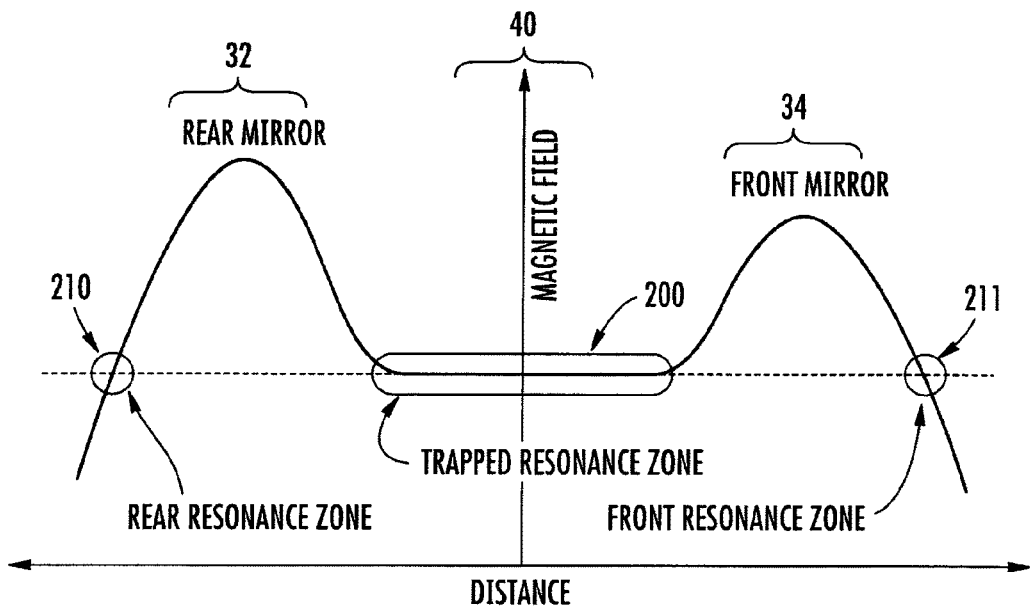
FIGS. 10A and 10B are graphical representations of the ECR resonance zones for the magnetic confinement fields when the ECR is operating in an on-resonant and an off-resonant mode, respectively.
Figure 10B:
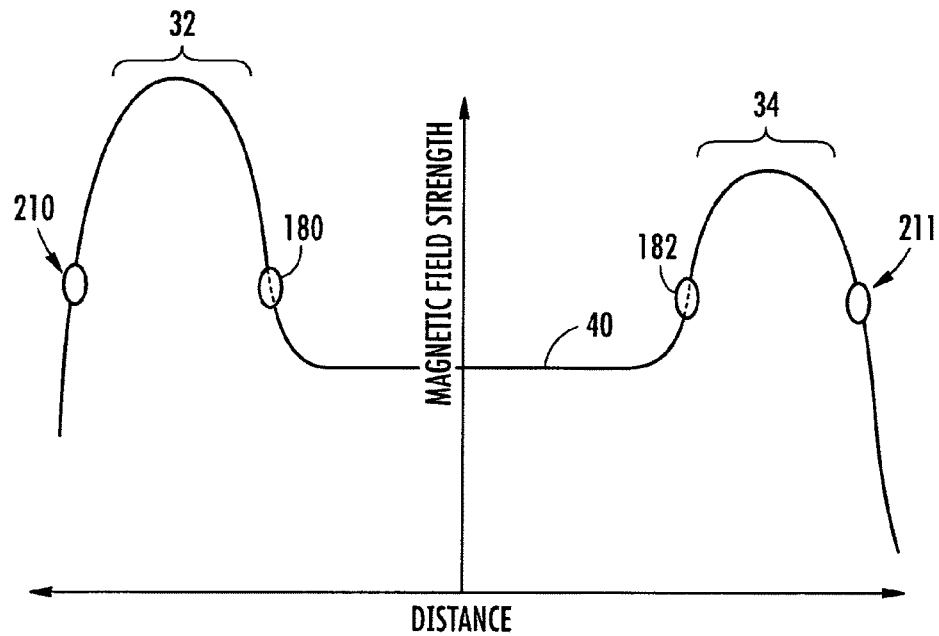

Referring to FIGS. 10A and 10B, system 10 may be operated in resonant (FIG. 10A) or sub resonant (FIG. 10B) ECR modes. In the resonant mode, ECR source 44 produces microwaves are resonant with the ECR motion of electrons the uniform field 40 (resonant zone 200 located between the two mirrors fields 32 and 34 as shown in FIG. 10A). This zone corresponds to a cylindrical volume about axis A in region 70 of chamber 30. This arrangement provides the highest coupling between the electrons and the microwaves.

The general requirements on the uniformity of the central field for the resonant mode can be expressed as a relation between the electron confinement time and the electron de-correlation time. If an electron is placed in a uniform magnetic field it will orbit about the field with the cyclotron frequency given by $$\omega_{ce} = \frac{eB}{m}.$$

If the electron motion is driven by an ECR drive generating a rotating electric field that rotates in the same direction as the electron, the electron can gain energy. If the drive frequency ($\omega_{ECR}$) exactly matches the electron cyclotron frequency the electron will continue to gain energy until relativistic corrections to the electron motion become significant. In typical embodiments this is not a significant issue as relativistic corrections will be come significant when the electron energy becomes a significant fraction of the electron rest energy. (The electron rest energy is 512 keV and, for many embodiments, target electron energies are 200-300 eV for alpha particle production, and about 1 keV for production of $C^{6+}$).

If the drive frequency does not exactly match the electron cyclotron frequency, then the electron will first gain energy then loose energy, and then gain it again. In fact, when the electron looses energy it will return to the same initial conditions as before it was accelerated by the ECR drive. The time scale of this loss and gain of energy is given, in terms of the ECR frequency $\omega_{ECR}$ by $$\tau_{DC} = \frac{\pi}{|\omega_{ce} - \omega_{ECR}|}.$$

The gain (or loss) of energy of an electron in an off-resonant ECR drive field is also limited by $$\Delta K_{max} \approx \frac{m\xi^2}{2(\omega_{ce} - \omega_{ECR})^2}$$

where $\xi$ is the normalized electric field eE/m.

In some embodiments, the field is not completely uniform. In such a case, the cyclotron frequency can be replaced with an average cyclotron frequency experienced by the electron. Or more accurately an average value over all the electrons of the average cyclotron frequency experienced by each electron.

Given these conditions we can express a sufficient condition on the uniformity of the field as the de-correlation time must be longer or on the order of the electron confinement time in the device. For the on resonant mode, when this condition is met, the field may be considered to be substantially uniform.

In some embodiments field 40 is uniform to 1% or less, 5% or less, 10% or less over a region extending axially 5 cm, 10 cm, 15 cm, 30 cm or greater, while the mirror-to-mirror distance is 60 cm.

In some cases, operation in the resonant mode may result in too energetic electrons. For example, in the case of formation of $He^{++}$, the peak of the cross sections for all formation methods is between 200-300 eV. Given sufficient power and coupling, electron temperatures well above 10 keV can be generated. These high energy electrons are not useful for the formation of the $He^{++}$, and tend to produce unwanted X-rays. The electron temperature can be controlled by manipulating the microwave power, gas pressure, the length of the resonant zone(s) and electron confinement time.

An alternative system, as shown in FIG. 10B, for controlling the electron temperature is to adjust the magnetic field in the central region 40 such that the ECR drive is detuned from the uniform field 40. This is referred to herein as the sub-resonant mode. This mode restricts the microwave coupling to zones 180 and 182 localized on each end of the chamber 30 adjacent the mirror field zones 32 and 34 (in contrast to the large cylindrical volume in which coupling occurs in resonant mode operation). The lower the central field 40, the smaller these zones 180 and 182 become. This method has the advantage that high microwave power in this configuration corresponds mostly to high electron (and plasma) density and not to high electron temperature. This method can be more efficient for production of low to moderate ionization states (such as $He^{++}$).

In this mode of operation there are two small ECR sections 180 and 182 located between the uniform field region and the magnetic mirrors. Particles are not in these zones long enough for de-correlation to be a significant issue. Electrons pass through the ECR zone, and depending on the phase of the particle relative to the ECR drive phase, the particle will gain or loose some energy in the zone. Because the phase at which the vast majority of electrons encounter both ECR zones is not correlated, they gain or loose energy each time they pass through the ECR zones. This leads to a stochastic heating process (similar to random walk) that leads to the gradual gain of energy (i.e. gradual as comparison to the resonant mode using similar operating parameters). For this process directly there are not requirements on the field uniformity of the central field, but the limitations on plasma stability still apply.

In some embodiments with this configuration the relation between the central field and the ECR frequency is significant. If these two match too closely, then one cannot consider the electrons to leave the ECR zone, and the entire central region appears to be one large ECR zone that is off-resonance. If this is the case the performance of the system is very poor, as the energy gained by the electrons is limited by the relation given above. Further the de-correlation time is short, so the electrons gain and loose energy rapidly leading to poor confinement.

If the central region corresponds to a magnetic field that is sufficiently far from the resonance condition, then the energy that can be gained or lost by an electron crossing the zone is limited by the relations above. Further, if the central region is sufficiently far from the resonant condition, other effects dominate the transit through the central region. This allows the electron phase to be effectively randomized between the two ECR zones. This reduces or eliminates the number of particles that are consistently poorly phased matched between the two zones.

The ICR exciter system 62 can be used as there still will be a uniform magnetic field 40 in the center of the chamber 30, but the ECR zones will be located only adjacent the zones of the mirror fields 32 and 34. In such cases, the ICR frequency is decreased slightly to match the lower resonant field. An added advantage is the mirror ratios on the front and back mirror fields 32 and 34 are increased somewhat as the central field 40' is lowered.

Figure 15:
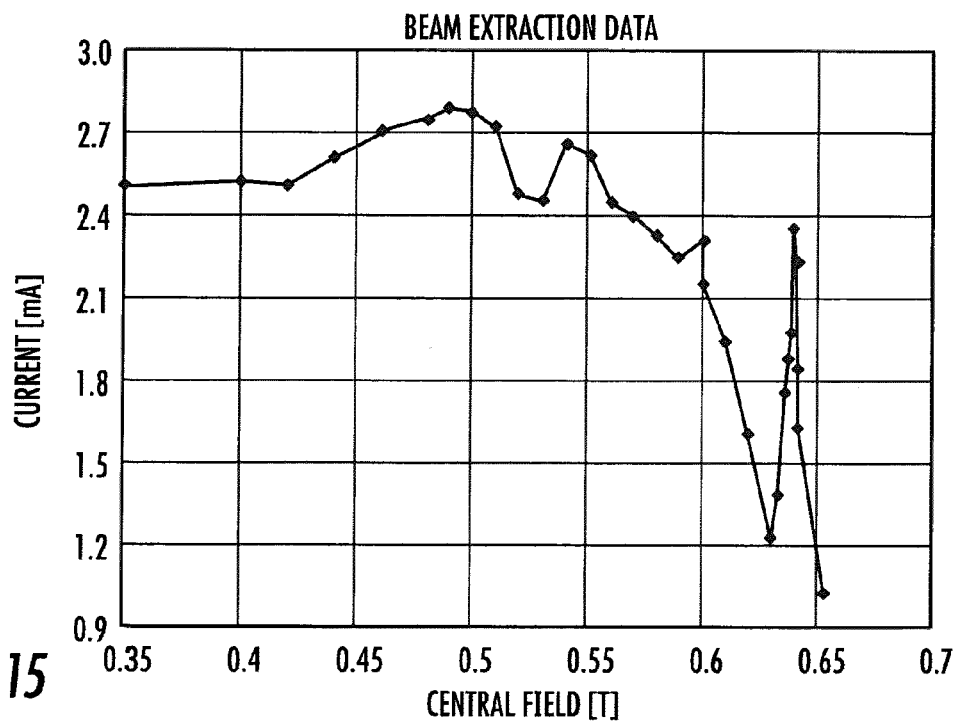
FIG. 15 is a plot of total extracted beam current as a function of central magnetic field strength for an ion beam system.

FIG. 15 illustrates both resonant and sub resonant modes of operation. FIG. 15 is a plot of total extracted beam current as a function be central magnetic field (at constant ECR drive frequency of 18 GHz) using small aperture. The sharp peak located at approximately 0.638 T corresponds to resonant mode of operation. The broad flat peak around 0.5 T corresponds to the sub-resonant mode of operation.

Note from the graph it may appear that the sub-critical mode of operation yields more current and thus may be better, but this can be misleading. The data was taken by varying only the central field, thus the mirror ratio, which is strongly tied to plasma production, is not constant across the graph. Also the beam composition is not plotted here so the ratio of $He^{++}$ to $He^+$ also varies along the graph.

The region between 0.635 T and 0.56 T, neither mode fully applies. Clearly close of 0.63 T the electron de-correlation time is short, and the maximum energy obtained the electrons is too low for the formation of $He^{++}$. As one approaches the 0.6 T, the ECR zones have moved out from the central region, toward the higher field, but the zones may be too large and too well correlated to lead to an efficient stochastic heating process.

Figure 16:
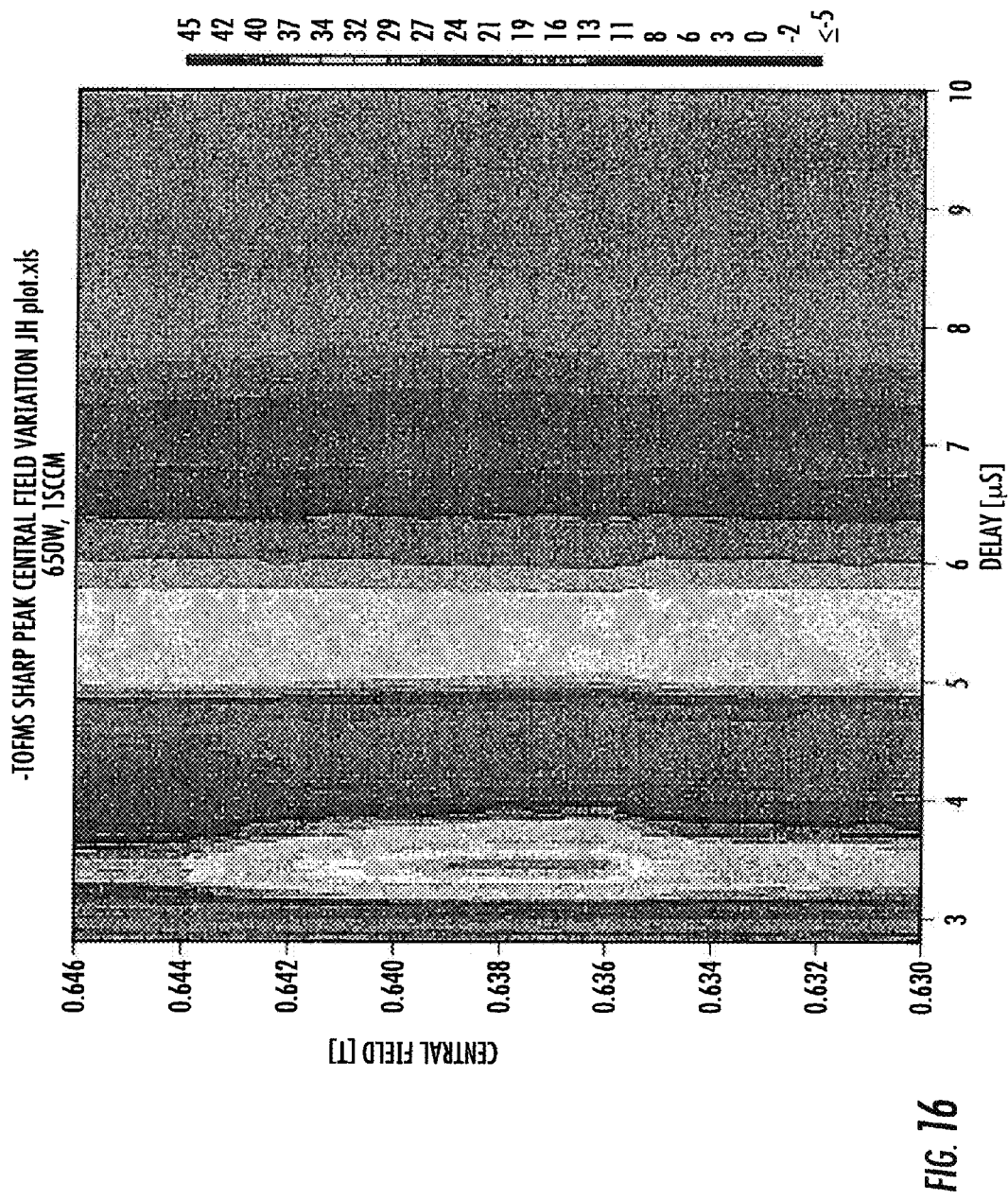
FIG. 16 shows time-of-flight mass spectrometer data for an ion beam generated in the ECR resonant mode of operation.

FIG. 16 shows time-of-flight mass spectrometer data for the resonant mode of operation. The horizontal axis represents time; the data near 3.5 μs corresponds to He++ and the data near 5.5 μs corresponds to He+. The vertical axis indicates the central magnetic field. Note the He++ production is flat between 0.636 T and 0.639 T. This region corresponds to the electron de-correlation time being longer then the electron confinement time so electrons are lost before they can decelerate.

The uniform field region also has another advantage other then just coupling energy to the electrons or ions. In some embodiments, mirror devices are unstable to a number of instabilities driven by the curvature of the magnetic field. In particular, the shape of the field in the region between the uniform field and the magnetic mirror can be very unstable. In this region the combined drift of the particles in the curved magnetic field is given by $$\vec{v} = \vec{v}_R + \vec{v}_{VB} = \frac{m}{q} \frac{\vec{R}_C \times \vec{B}}{R_C^2 B^2} \left( v_\perp^2 + \frac{1}{2} v_\parallel^2 \right)$$

where $R_C$ is the radius of curvature of the magnetic field. These drifts cause ions and electrons to drift in opposite directions. The resulting electric field generated by the change separation gives rise to a radial E×B drift $$\vec{v}_{E \times B} = \frac{\vec{E} \times \vec{B}}{B^2}$$

that can lead to radial diffusion. When the magnetic field is curved toward the plasma (concave) the resultant drift causes outward transport and loss of the particles. This is often referred to as "bad" curvature. On the other hand, when the magnetic field is curved away from the plasma (convex) the resultant drift causes inward transport and confinement of particles. This is often referred to as "good" curvature.

In a simple magnetic mirror, the particles spend much more of their time in the regions of "bad" curvature then in the regions with "good" curvature and this leads to rapid radial loss of particles.

In the systems described herein, the uniform field regions greatly increase the stability of the plasma and provide for ion confinement time that is comparable to the time required to remove the second (or more) electron(s) to form ions in the selected final state.

The increased stability is provided by a number of factors. First, the uniform sections have essentially no curvature so they decrease the overall time particles spend in the regions of "bad" curvature. There are thresholds associated with the instabilities that lead to transport. Clearly curved magnetic field driven instabilities will not grow if the average magnitude of the drifts are smaller then thermal transport drifts. Second, the uniform field region contains a large fraction of the plasma. This region provides a charge reservoir that damps out the change separation caused by the curved magnetic field drifts. Basically this allows charge to flow along the axis and neutralize the change separation caused by the "bad" curvature region. Third, the uniform region disconnects the two regions of "bad" curvature. Thus instabilities growing on one end of the device generally cannot couple to instabilities growing on the other side of the device due to inconsistent phase shifting by particles traveling from one side of the device to the other.

In some embodiments, requirements on the field are on the order of 5-10% uniformity over the majority of region 70. Stability may be more of an issue in the sub-critical mode because of the potentially higher mirror fields which reduces the threshold for instabilities.

Figure 14:
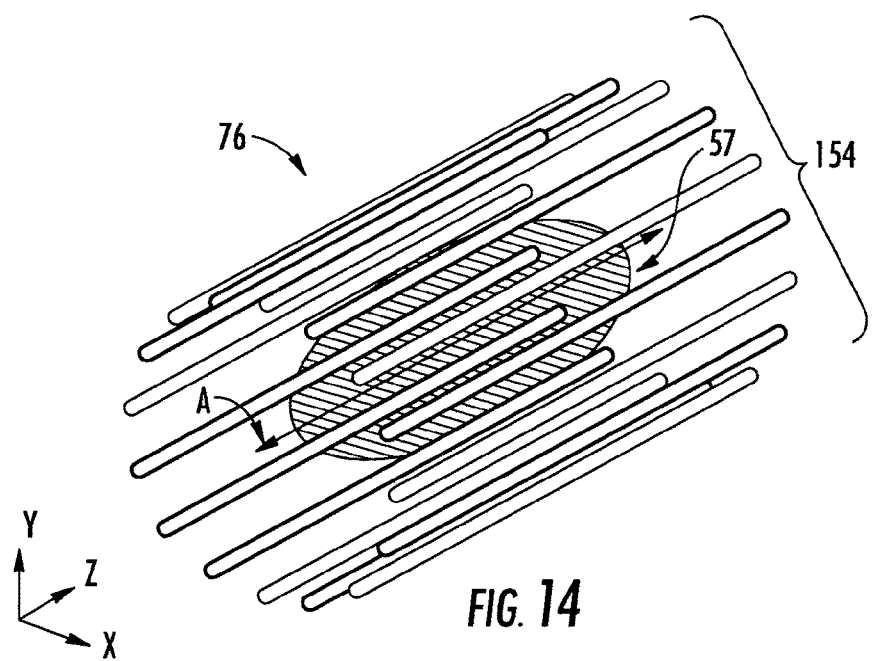
FIG. 14 shows a multipole radial confinement magnet.
Figure 14A:
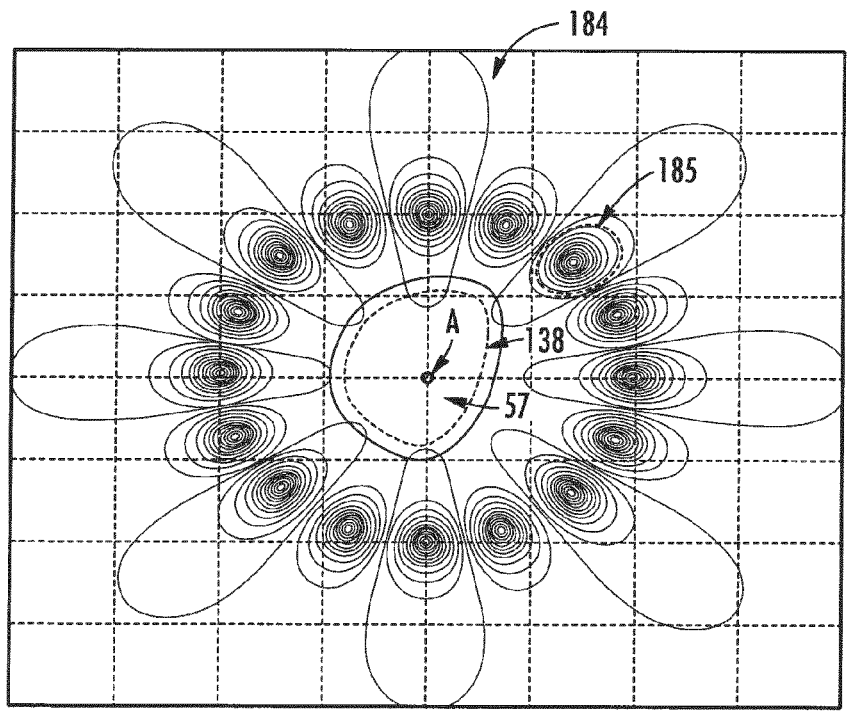
FIG. 14A shows the magnetic field generated by a multi-pole radial confinement magnet.

Referring to FIGS. 14 and 14A, in some embodiments, (e.g. for generation of very highly ionized ion species and/or for generation of very intense ion beams) it may be helpful to add a radial surface confinement magnetic 76 to the system 10. Confinement magnet 76 produces radial confinement field 184 turns the axial minimum field configuration into a more complete minimum field confutation, by adding a generally increasing magnetic field as a function of radius. Note that a true minimum magnetic field configuration cannot be generated (such a static configuration would violate Maxwell's laws). Configurations referenced to in the art as "true" magnetic minimum configurations are just partial minimum magnetic fields. All of these types of configurations contain cusp regions where the field does not increase as a function of radius. The size, shape, and location of these regions distinguish these different minimum magnetic field configurations.

The surface confinement magnetic field increases the confinement time of the electrons in the system 30. This increases the electron density in the system 30, as well as the electron temperature (energy), as the electrons are in the ECR drive field longer. Higher electron density corresponds to more ionizing collisions with neutrals and ions. Higher electron energy corresponds to the ability to generate higher ionization states. This is not useful for He++, but could used for creating highly ionized states of other atoms.

In some embodiments, a hexapole fixed magnet system (not shown) is used to generate a "true" minimum magnetic field configuration. The hexapole magnets of alternating polarities create a field that penetrates radially well into the plasma 57, and limits the microwave coupling region, as well as preventing the use of an ICR exciter system, because of the lack of a uniform magnetic field region.

As shown in FIGS. 14 and 14A, a higher order multipole field is used to produce a surface confinement field 184 that would only affect the edges 138 of the plasma 57, allowing for a broad ECR coupling region and use of an ICR exciter. A higher order multipole field can be introduced using fixed magnets, but it can also be introduced using a series of current carrying wires 154, located around the source area. In such a case, each wire 154 would carry current in the opposite direction to the adjacent wire 154, giving rise to an adjustable multipole magnetic field 184. The strength of the current in the wires 154 determines the multipole field 184, which can be quite strong very close to the wires 154, e.g. in region 185. The wires 154 used to generate the multipole field 184 can be twisted or straight (as shown). The same wires 154 can be used to produce the multipole field 148 and act as the ICR antenna for the "twisted" or "untwisted" filers. In such an implementation, the wires 154 would carry a DC and an AC component to the current and thus establish both DC and AC components of the field 148. In some embodiments, the number of wires 154 used for a multipole may be high (more than the eight pairs shown), new phases could be introduced in the ICR drive to increase the coupling efficiency, or some arrangement like every other wire 154 could carry an ICR drive signal.

Referring again to FIG. 2A, system 10 uses a microwave horn 55 to direct the microwaves for the ECR plasma production. In some embodiments, a higher efficiency can be obtained using a cavity system (not shown). The cavity both localizes the microwaves and the gas used in the system 10. Localizing the microwaves is good in that it increases the microwave power density and thus the plasma density. Increasing the plasma density increase the number of ionizing collisions that can occur. It also reduces shielding and other problems from the microwaves.

Localizing the gas decreases the amount of wasted feed gas, generally not a large expense, but less waste is less waste and some rare feed gases are relatively expensive. This also reduces arcing problems caused by high gas pressures in the chamber 30. If the feed gas is localized in the cavity for the most part, it will not be in the antenna system, or the insulators. The lower the gas pressure can be kept outside the gas generator, the better for suppression of arcs.

It is not necessary for the cavity to be fully closed in a gas tight sense. A number of holes can be placed in the wall as long as they are small compared to the wavelength of the microwaves. This will confine the microwaves, but allow evacuation of the gas. Limiting the holes in the wall controls the conductance to the rest of the vacuum system. This can be used to keep the gas pressure high in the cavity but low in the rest of chamber 30.

The gas source 50 can be operated using a wide variety of material feeds. In most cases these feed systems provide a neutral stream of particles from which to make a plasma and thus a beam.

In the case of alpha production, helium gas is used as a working gas. In the case of most other gaseous materials they can be used as a working gas for the system. It does not matter if they are not simple atomic gasses. For example, if an oxygen ion source is desired, molecular oxygen can be injected into the source. The hot electrons will both dissociate the oxygen and ionize it.

For materials that are not normally a gas there are several ways to inject the material into the source. One alternative is to inject a gas containing the desired material. For example, carbon could be injected using CO or $CO_2$ as a working gas. In both cases, the plasma generated will contain both carbon and oxygen ions, thus the beam generated will contain both types of ions. The source may be followed by a mass filter to eliminate the undesired ions.

An alternative would be to vaporize the substance into system 10. In a case such as calcium, it would be possible to simply heat solid calcium to vaporize it using an oven. Materials could also be vaporized by e-beam. This type of source is well suited to production of materials with low melting points such as barium and calcium.

A laser system can be used to oblate a target, giving rise to neutral material from which the plasma is formed. Such a system would fire a laser at a cooled target located in the chamber to produce neutrals. The prime choice for the target location would be in the region 70 between the two magnetic mirror fields 32 and 34. In some embodiments, this location makes the optics some what difficult so placement to the rear of the system, near the peak of the rear mirror, has a number of advantages. Other placements are workable, but may require more laser power to generate sufficient neutral particles between the magnetic mirrors 32 and 34.

One way to inject material is to use sputtering. Here the exiting ECR source and magnetic mirrors may be used to generate a sputter source for almost any solid material. Referring to FIGS. 10A and 10B the ECR source may be adjusted to make unconfined hot electrons at resonant zones 210 and 211 on both sides of the rear mirror. The non-trapped hot electrons generated on the front and back of the mirrors are not useful for generating plasma 57. These electrons are not confined and typically are quickly lost. Further resonance zones 210 and 211 are typically very narrow so there is not sufficient time for the electrons to gain a lot of energy. However, in embodiments featuring a sputtering source, one can use the unconfined hot electrons on the back side of the mirror to form a sputter source. In such a case it would be desirable to tailor the magnetic field so the gradient is not so steep at zone 210 such that the resonance zone is sufficiently large to produce the desired plasma density.

Figure 11:
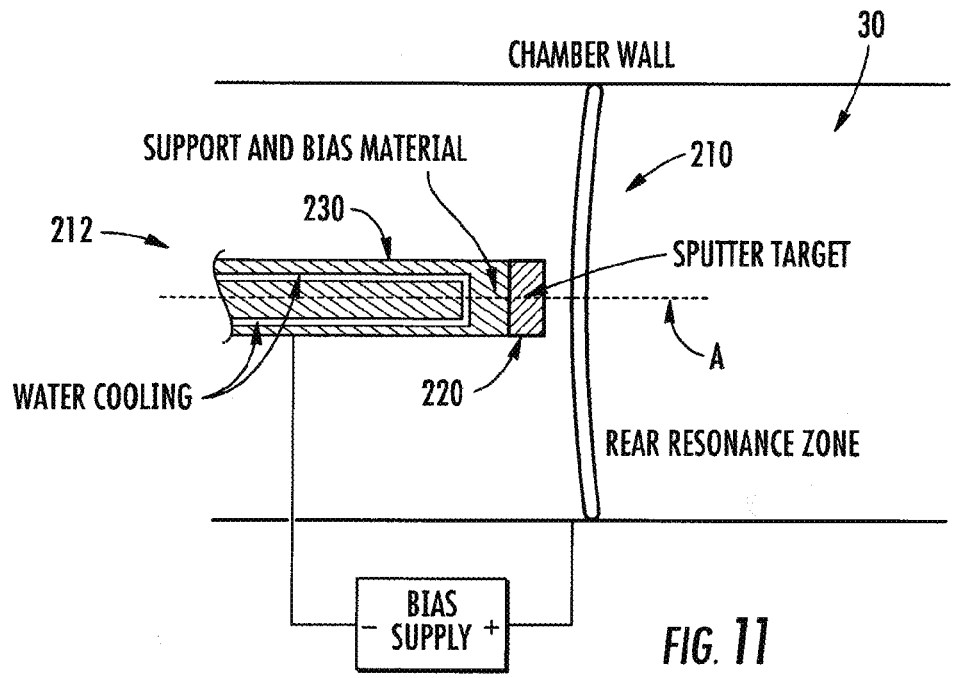
FIG. 11 is a simplified cross-sectional view of a sputter source implemented with an axially located target, showing different support and bias material, and sputter material.
Figure 12:
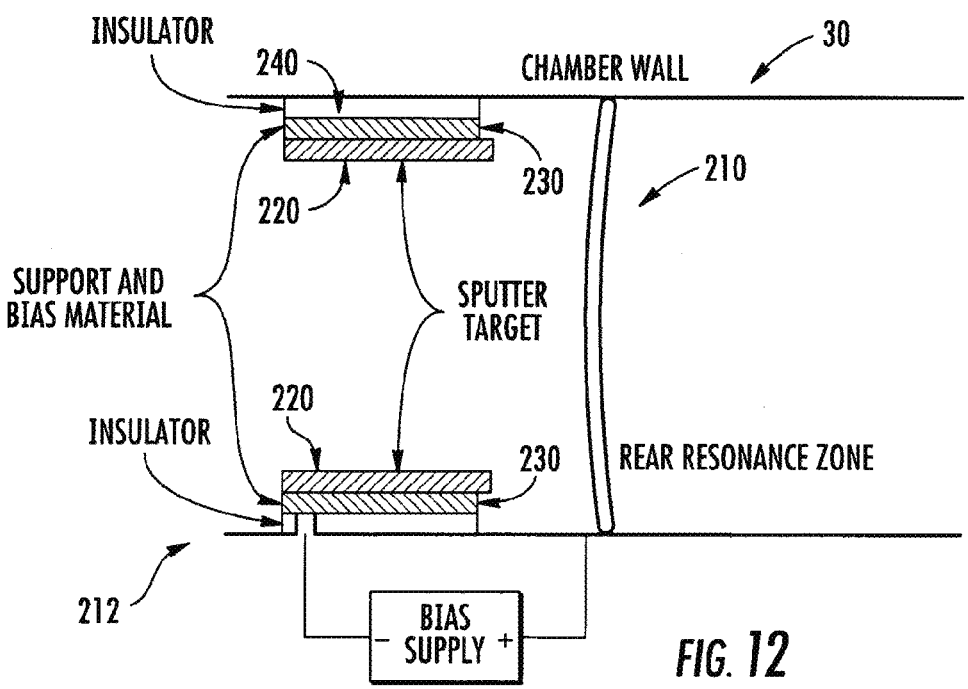
FIG. 12 is a simplified cross-sectional view of a sputter source implemented with an annular target.
Figure 13:
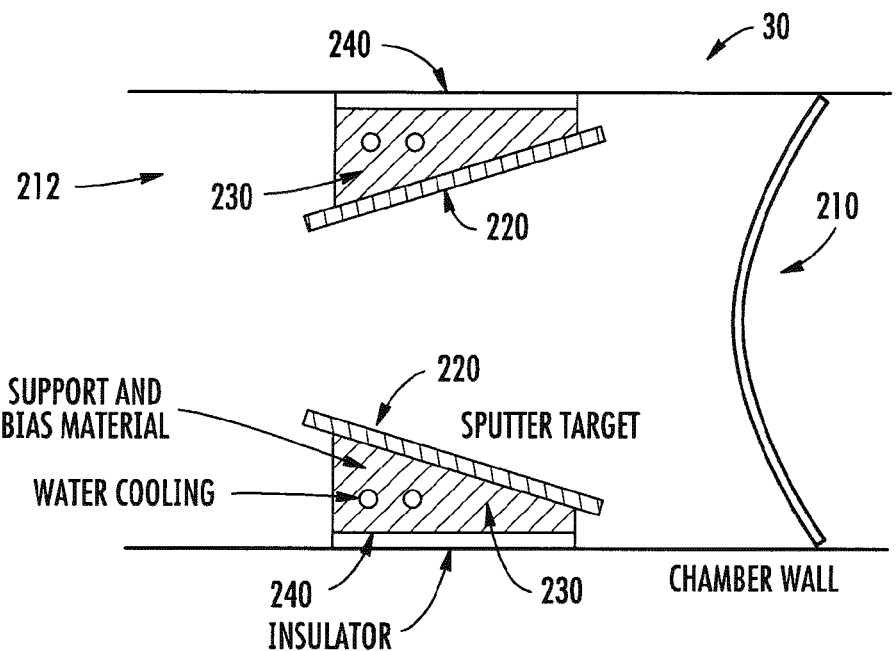
FIG. 13 is a simplified cross-sectional view of a sputter source implemented as a conical sputter target.

Referring to FIGS. 11, 12, and 13, a sputter source 212 works by allowing the hot electrons to ionize small amounts of gas to form a plasma in the vicinity of rear resonance zone 210. The sputter target is biased with a large negative bias (e.g. 1-4 kV). This negative bias draws ions from plasma formed and accelerates them to high energies. These ions then strike the sputter target 220 producing a number of neutral particles. These neutral particles then pass through the hot electrons in resonant zone 210. Some fraction of them are ionized, attracted by the negative potential, impact on the target 220, and sputter off more neutral particles. Some of the neutral particles pass through the hot electrons and become ionized in the trapped resonance zone 200 (in resonant mode) or zones 180 an 182 (in sub-resonant mode) and form part of the particle beam.

The target material 220 does not have to be electrically conducting in order to make a sputter target. For example, carbon can be used as a target by simply placing it on a conducting surface 230. The conductor 230 is biased to create the potential necessary to accelerate ions, but it is not necessary to bias the actual surface of target material 220. Conductor 230 my be isolated from the walls of chamber 30 by an insulator 240.

In some embodiments, sputter source 212 may include fluid cooling pipes. Any suitable cooling technique known in the art may be employed.

In some cases the target material 220 does not sputter well. This can be expressed as a sputter yield. The average number of neutral particles sputtered from the surface per single ion hitting the surface is the sputter yield. Materials that form good sputter targets have a yield greater then 1 (often significantly greater). If a material with a low sputter yield is desired, a carrier gas can be used to increase the yield. Generally heavy gasses such as xenon are desirable because they tend to have high sputter yields on most targets and cause minimal problems in the system. Some of the carrier gas will get ionized and find its way into the output beam, but this can be minimized by correct choice of the gas, geometrical arrangement, and/or filtered in the output beam.

In some embodiments, the geometry of a sputter source 212 is important. It is necessary that ions from the plasma can be accelerated into the sputter target 220, that neutral particles have a clear path into the plasma 57, and that the source does not block key things such as the microwave access to the resonant zone. For example, sputter source 212 may fall into one of two geometrical configurations. These are a sputter target 212 located on axis A (as shown in FIG. 11) and one located in an annulus (as shown in FIG. 12) or cone (as shown in FIG. 13) around axis A.

An ECR sputter source may be particularly well suited for generation of multiply changed ion beams from solid materials. As a practical example, there are applications for highly charged nickel ion beams. This source is particularly well suited to production of a nickel ion beam.

Referring to FIG. 11, in the case of an axially located target 220, the sputter target covers a small area along the axis of the ion source. The ECR microwaves are allowed to flow around the target, and may even be injected off-axis to improve access.

In some embodiments, one may alternatively generate a sputter source using ions from the main confined plasma. Biasing is used to attract ions from the confined plasma to a sputtering target. For example, the ions may be drawn backwards into a plate on the axis biased negative relative to the plasma. In such embodiments, it is not necessary to create an unconfined plasma. In some embodiments, this may have advantages for microwave access at high plasma density.

The extraction system 59 passes the beam 56 through an extraction limiter 65, forming the first electrode of the extraction system. The beam 56 is allowed to follow the magnetic field and expand as the magnetic field decreases. A focusing lens 64 is used to converge the beam into the final limiter, which forms the boundary between the ion beam source system 10 and the following systems (e.g. a beam filter or accelerator).

By allowing the beam 56 to initially expand into a low field region then accelerating the beam to extraction energy, it is possible to transition the beam from the high field region magnetic field region 32, 34, and 40 to a low field region without increasing the beam emittance.

In various embodiments, other suitable extraction systems and techniques known in the art may be employed.

The vacuum system 54 can be implemented using almost any standard pumping system. The high vacuum pumps should provide a base pressure at least as low as $1 \times 10^{-5}$ torr. During operation the gas or vapor from the atom source 50 can be bled into the system 10 at a higher pressure, providing high purity of the working gas.

There are a number of potential applications for high energy alpha ($^4$He$^{++}$) or helium-3 ($^3$He$^{++}$) beams. The most immediate applications are the activation of target nuclei for the production of radio-isotopes. Due to short half-life and/or low production yield, it is necessary to use an intense beam in order to produce reasonable quantities of many of these radio-isotopes. Also, by using a target of very high purity, few undesirable products are made so post processing (e.g. chemical separation) for isotope purity is minimized.

The following list indicates some of the possible target radio-isotopes that can be produced from various targets using He$^{++}$ beams:

$^{18}$F, $^{123}$Xe/I$^{123}$, $^{67}$Ga, $^{111}$In, $^{131}$Ba, $^{68}$Ge, $^{82}$SrRb$^{82}$, $^{89}$Sr, $^{153}$Sm, $^{124}$I, $^{211}$At, $^{148}$Gd, $^{76}$Br, $^{199}$Tl, $^{100}$Pd, $^{128}$Ba, $^{117m}$Sn, and $^{229}$Th Many of these radio-isotopes either are not currently produced or are only produced in very limited quantities because of the difficulties in their production. Using a $^3$He$^{++}$ or $^4$He$^{++}$ beam, however, many of these radio-isotopes can be effectively produced. For example alpha ($^4$He$^{++}$) particles can be used to produce desirable products as follows:

$^{12}$C ($\alpha$, n) $^{15}$O
$^{15}$N ($\alpha$, n) $^{18}$F
$^{79}$Br ($\alpha$, n) $^{82}$Rb
$^{86}$Kr ($\alpha$, n) $^{89}$Sr
$^{96}$Zr ($\alpha$, n) $^{99}$Mo
$^{100}$Ru ($\alpha$, n) $^{103}$Pd
$^{106}$Pd ($\alpha$, n) $^{109}$Cd
$^{114}$Cd ($\alpha$, n) $^{117m}$Sn
$^{121}$Sb ($\alpha$, n) $^{124}$I
$^{120}$Te ($\alpha$, n) $^{123}$Xe($^{123}$I)
$^{60}$Ni ($\alpha$, 2n) $^{62}$Zn($^{62}$Cu)
$^{66}$Zn ($\alpha$, 2n) $^{68}$Ge($^{68}$Ga)
$^{80}$Kr ($\alpha$, 2n) $^{82}$Sr($^{82}$Rb)
$^{83}$Kr ($\alpha$, 2n) $^{85}$Sr
$^{109}$Ag ($\alpha$, 2n) $^{111}$In
$^{121}$Sb ($\alpha$, 2n) $^{123}$I
$^{123}$Sb ($\alpha$, 2n) $^{125}$I
$^{129}$Xe ($\alpha$, 2n) $^{131}$Ba($^{131}$Cs)
$^{197}$Au ($\alpha$, 2n) $^{199}$Tl+2n
$^{199}$Hg ($\alpha$, 2n) $^{201}$Pb ($^{201}$Tl)
$^{206}$Pb ($\alpha$, 2n) $^{208}$Po $^{209}$Bi ($\alpha$, 2n) $^{211}$At
$^{61}$Ni ($\alpha$, p) $^{64}$Cu
$^{64}$Ni ($\alpha$, p) $^{67}$Cu
$^{108}$Cd ($\alpha$, p) $^{111}$In
$^{114}$Cd ($\alpha$, p) $^{117}$In($^{117m}$Sn)
$^{120}$Te ($\alpha$, p) $^{123}$I
$^{122}$Te ($\alpha$, p) $^{125}$I
$^{163}$Dy ($\alpha$, p) $^{166}$Ho
$^{174}$Yb ($\alpha$, p) $^{177}$Lu Other transmutations can occur to produce the same product, for example:

$^{144}$Sm ($\alpha$, gamma) $^{148}$Gd
$^{147}$Sm ($\alpha$, 3n) $^{148}$Gd
$^{147}$Sm ($^3$He$^{++}$, 2n) $^{148}$Gd For some reactions, production using alpha particles is greatly improved relative to other methods. Examples include $^{108}$Cd ($\alpha$, p) $^{111}$In
$^{121}$Sb ($\alpha$, 2n) $^{123}$I
$^{83}$Kr ($\alpha$, 2n) $^{85}$Sr
$^{15}$N ($\alpha$, n) $^{18}$F
$^{66}$Zn ($\alpha$, 2n) $^{68}$Ge($^{68}$Ga)
$^{150}$Nd ($\alpha$, n) $^{153}$Sm
$^{96}$Zr ($\alpha$, n) $^{99}$Mo
$^{121}$Sb ($\alpha$, n) $^{124}$I
$^{197}$Au ($\alpha$, 2n) $^{199}$Tl Some isotopes that can be produced, e.g. in usable quantities, essentially exclusively with alpha (or He-3) particles. Exemplary reactions include $^{209}$Bi ($\alpha$, 2n) $^{211}$At
$^{121}$Sb ($\alpha$, n) $^{124}$I
$^{144}$Sm ($\alpha$, gamma) $^{148}$Gd
$^{147}$Sm ($\alpha$, 3n) $^{148}$Gd
$^{147}$Sm ($^3$He, 2n) $^{148}$Gd
$^{116}$Cd($\alpha$,3n)$^{117m}$Sn In some embodiments, a beam of deuterium ions may be used to drive the following reactions:

$^{30}$Te (d,n) $^{131}$I+
$^{200}$Hg (d, n) $^{201}$Tl
$^{130}$Te (d, n) $^{131}$I
$^{64}$Ni (d, 2n) $^{64}$Cu
$^{15}$N (d, 2n) $^{15}$O
$^{132}$Xe (d, 2n) $^{132}$Cs
$^{110}$Cd (d, n) $^{111}$In
$^{176}$Yb (d, n) $^{177}$Lu

In some embodiments, a beam of protons (Hydrogen ions) may be used to drive the following reactions:

$^{18}$O (p, n) $^{18}$F
$^{124}$Te(p, n) $^{124}$I
$^{124}$Te (p, 2n) $^{123}$I
$^{85}$Rb (p, 4n) $^{82}$Sr
$^{201}$Hg (p, n) $^{201}$Tl

Ion sources of the types described herein may also drive reactions such as:

$^{67}$Zn ($^3$He, 2n) $^{68}$Ga
$^{199}$Hg ($^3$He, n) $^{201}$Tl
$^{16}$O ($^3$He, p) $^{18}$F
$^{61}$Ni ($\alpha$, p) $^{64}$Cu
$^{64}$Ni ($\alpha$, p) $^{67}$Cu
$^{108}$Cd ($\alpha$, p) $^{111}$In
$^{114}$Cd ($\alpha$, p) $^{117m}$In($^{117m}$Sn)
$^{120}$Te ($\alpha$, p) $^{123}$I
$^{122}$Te ($\alpha$, p) $^{125}$I
$^{163}$Dy ($\alpha$, p) $^{166}$Ho
$^{174}$Yb ($\alpha$, p) $^{177}$Lu As noted above, for treatment of radioactive waste, there are at least two types of radioactive waste transmutation. The first is the production of useful products from waste material.

Exemplary transmutations which may be accomplished using the devices and techniques described herein include:

$^{226}$Ra $(\alpha, n)$ $^{230}$Th+n. ($^{230}$Th is a source for $^{213}$Bi.)

$^{232}$Th+$\alpha \rightarrow ^{235}$U which is nuclear fuel.

$^{235}$U+$\alpha \rightarrow ^{238}$Pu which is used in nuclear fuel cells as a heat source and is in short supply.

$^{231}$Pa+a$\rightarrow ^{233}$Np+n$\rightarrow ^{229}$Pa$\rightarrow ^{225}$Ac which is a medical isotope. The $^{225}$Ac decay path is $^{225}$AC-$\alpha \rightarrow ^{221}$Fr-$\alpha \rightarrow ^{217}$At-$\alpha \rightarrow ^{213}$Bi-beta$\rightarrow ^{213}$Po-$\alpha \rightarrow ^{209}$Pb-beta$\rightarrow ^{209}$Bi.

Second, waste may be converted to a stable product. Exemplary transmutations which may be accomplished using the devices and techniques described herein include:

$^{251}$Cf+$\alpha \rightarrow ^{253}$Fm+2n converts long lived Cf isotopes to short lived (approximately 3 days) Fm isotope, $^{237}$Np+$\alpha \rightarrow ^{239}$Am+n$\rightarrow ^{235}$Np$\rightarrow ^{231}$Pa$\rightarrow$ ... $\rightarrow$Pb.

Another other issue in treatment of nuclear waste is stimulated fission reactions. In this case heavy radioactive nuclides are bombarded with alpha particles from a beam source of the type described herein. These nuclides undergo a stimulated fission reaction and fall apart into a number of lighter fragments. Generally the fragments are still radioactive, but have short half-lives and quickly decay to stable elements. Unlike many of the heavy nuclei, which are alpha and neutron emitters, these lighter ones are more likely beta and position emitters, which are easier to deal with. Intense (very intense) alpha beams are ideal for this type of application.

$^{99m}$Tc is a metastable nuclear isomer of $^{99}$Tc, indicated by the "m". "Metastable" means that $^{99m}$Tc does not change into another element upon its decay. Instead $^{99m}$Tc emits a 140 keV gamma ray that medical equipment can detect from a body into which it has been injected. Accordingly $^{99m}$Tc is well suited for the role of a medical tracer because it emits readily detectable 140 keV gamma rays, and its half-life for gamma emission is 6.01 hours. Over 93% of it decays to $^{99}$Tc in 24 hours. This short half life of the $^{99m}$Tc allows for scanning procedures which collect data rapidly, but keep total patient radiation exposure low. $^{99}$Tc is the ground state of $^{99m}$Tc that eventually (half-life of 213 thousand years) emits a beta particle and decays to $^{99}$Ru, which is stable.

$^{99m}$Tc usually is extracted from so called "moo cows", $^{99m}$Tc generators which contain $^{99}$Mo. The majority of $^{99}$Mo heretofore produced for $^{99m}$Tc medical use comes from fission in nuclear reactors, and must be processed carefully to remove nuclear contaminates.

20 million diagnostic nuclear medical procedures every year use $^{99m}$Tc, approximately 85% of diagnostic imaging procedures in nuclear medicine use this isotope. Depending on the type of nuclear medicine procedure, the $^{99m}$Tc is bound to different pharmaceutical that transports it to the required location. $^{99m}$Tc is chemically bound to Sestamibi when it is used to image the blood flow, or lack thereof, in the heart. Since Exametazime, is able to cross the blood brain barrier, $^{99m}$Tc is used with Exametazime so the $^{99m}$Tc flows through the vessels in the brain to image cerebral blood flow. Imaging of renal function is accomplished by tagging $^{99m}$Tc to Mercapto Acetyl Tri Glycine.

Similarly, $^{111}$In is a radionuclide with a half-life of 2.8049 days and with gamma ray emissions of 171.2 and 245.3 keV. In a chloride form, it is used as a bone marrow and tumor-localizing tracer; in a chelate form, as a cerebrospinal fluid tracer and in a trichloride form, is used in electron microscopy to stain nucleic acids in thin tissue sections. It decays by electron capture:

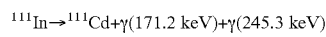
$^{111}$In$\rightarrow ^{111}$Cd+$\gamma$(171.2 keV)+$\gamma$(245.3 keV)

Electron capture decay can be though of as a positron decay where the positron is destroyed in the nucleus by an captured electron. In this case the decay produces the gamma ray emissions of 171.2 and 245.3 keV sensed in the PET scan.

For many applications, due to short half-life and/or low production yield, it is necessary to use an intense alpha particle beam in order to produce reasonable quantities of $^{99}$Mo or $^{111}$In. Particles beams of the type described herein may be used to produce diagnostic or therapeutically effective doses of these materials. As used herein, the phrase diagnostic or therapeutically effective dose is to be understood to mean a dose sufficient to perform at least one diagnostic or therapeutic procedure is a human or animal patient.

Advantageously, the devices and techniques described herein may be used to produce usable quantities of $^{99}$Mo or $^{111}$In without the use a nuclear fission reactor. Accordingly, production of dangerous radioactive byproducts may be reduced or eliminated. Also, by using beam targets of very high purity, few undesirable products are made so post processing for isotope purity is improved.

Figures 17A, 17B, 17C:
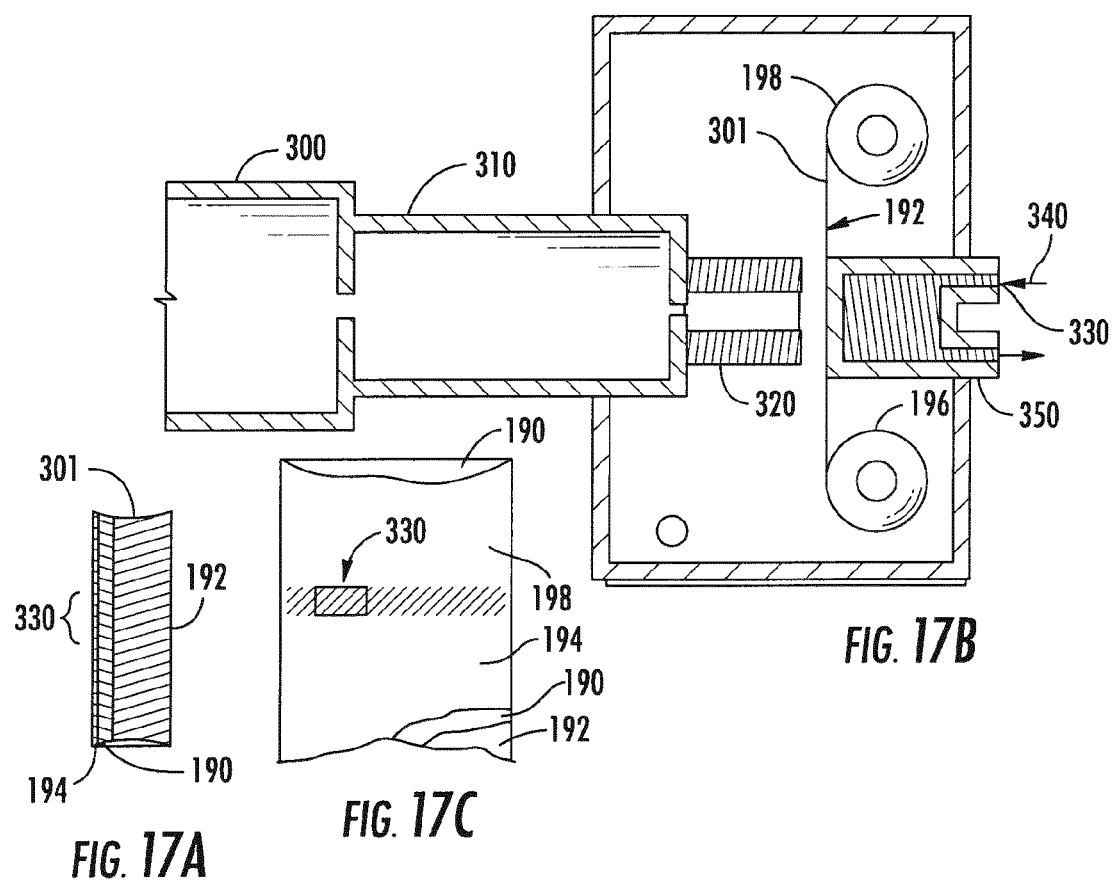
FIGS. 17A-C illustrate an exemplary target and target feed system.

Referring to FIGS. 17A, 17B, and 17C one exemplary production process is to form a target 301 by placing a layer 190 of $^{96}$Zr atoms on a copper strip 192 and then place a thin layer 194 of $^{109}$Ag atoms on the layer 190 of $^{96}$Zr atoms. The strip 192 is shown extending between a supply roll 196 and a take-up roll 198.

A beam from ion source 300 is accelerated by accelerator 310 to target 301. In some embodiments, accelerators 310 functions in a pulse mode so after the beam is spread into a rectangular shape by the beam spreader 320, either a pulse or more of alpha particles is directed at a rectangular area 330 of the strip 192 (in other embodiments, other beam shapes may be used). The target strip 301 is then indexed or moved continuously with respect to the beam. A cooling system can be used to cool the target 301. For example coolant may be circulated via ports 350. Any suitable cooling technique known in the art may be used.

In some embodiments, alpha particles are accelerated to the target 301 at an energy of approximately 28 MeV to transmute a portion of the $^{109}$Ag atoms of layer 194 into $^{111}$In. Alpha particles passing through layer 194 will lose some energy in the process, and thereafter, a portion will impinge on layer 190 at an energy of approximately 16 MeV, transmuting a portion of the $^{96}$Zr atoms or layer 190 into $^{99}$Mo. The copper, $^{109}$Ag, $^{111}$In, $^{96}$Zr, and $^{99}$Mo are easy to separate chemically so the copper, $^{109}$Ag and $^{96}$Zr remaining are recycled, and the $^{99}$Mo and $^{111}$In are chemically separated and used for medical isotope purposes.

Similar techniques may be used for targets with more that two layers of different target materials, or with a single layer of target material.

Although embodiments are shown above with target 301 mounted on a roll, and other suitable target mount may be used. In some embodiments, target 301 may mounted on a plate (not shown). The target plate is placed in front of the beam to undergo reactions, after which the plate may be changed. In some embodiments, a target station would support more then one plate at a time. This allows a first plate to be exposed to the beam while another plate is changed out and a new plate made ready during the exposure of the first plate. This reduces beam down time. Further, using plates in this manner allows the exposed product, which may have a short half-life, to be taken out quickly.

Note that in various embodiments, the systems and techniques described herein may also be used to produce beams of singly ionized ions. We can also use the source for production of singly charged ions. In some embodiments the system may selectively operable in several modes corresponding to different ion types and charge state outputs. In some embodiments, a single ion source may be used. Some embodiments may feature multiple ion sources. In some embodiments, multiple beams of various types may be generated from a single source, e.g. using charge or mass filtering techniques.

While particular embodiments of the present invention have been shown and described, it will be obvious to those skilled in the art that changes and modifications may be made without departing from the invention in its broader aspects and, therefore, the appended claims are to encompass within their scope all such changes and modifications as fall within the true spirit and scope of this invention. All patents, published applications and articles mentioned herein are incorporated by reference in their entirety.

What is claimed is:

1. An ion source comprising:
    a chamber disposed about a longitudinal axis and containing a gas;
    a magnetic confinement system configured to produce a magnetic field in a confinement region within the chamber, wherein the confinement region is disposed about the axis and extends along the axis from a proximal end to a distal end, and wherein the magnetic field comprises:
        a first magnetic mirror located at the proximal end of the confinement region;
        a second magnetic mirror located at the distal end of the confinement region;
        a substantially uniform magnetic field disposed about and directed substantially parallel to the longitudinal axis, the substantially uniform magnetic field being located between the first and second magnetic mirrors; and
    an electron cyclotron resonance driver which produces a time varying electric field which drives the cyclotron motion of electrons located within the confinement region, said driven electrons interacting with the gas to form a confined plasma;
    wherein, during operation, the magnetic confinement system confines the plasma in the confinement region such that a portion of atoms in the plasma experience multiple ionizing interactions with the driven electrons to form multiply ionized ions having a selected final ionization state;
    and wherein at least one of the following features is present:
    (i) the ion source comprises an ion cyclotron driver, which directs radiation to the confinement region to preferentially drive the cyclotron motion of ions in the plasma having a selected driven ionization state to increase the motional energy of said ions in directions perpendicular to the longitudinal axis;
    (ii) at least one magnetic mirror comprises a magnetic field extending outside of the confinement region; the electron cyclotron driver is tuned to the electron cyclotron frequency corresponding to a portion of the magnetic field extending outside of the confinement region to drive the cyclotron motion of unconfined electrons in said portion of the field, wherein said unconfined electrons interact with the gas to form an unconfined plasma; and the ion source further comprises a sputter target located in the chamber and proximal to said portion of the magnetic field, and biased to attract ions from the unconfined plasma, in response to collisions with the attracted ions, the sputter source emits neutral particles which form at least a portion of the gas of atoms;
    (iii) the gas comprises He atoms, and the magnetic confinement system confines the plasma in the confinement region such that a portion of He atoms in the plasma experience two singly ionizing interactions with the driven electrons to form alpha particles or $^3$He$^{++}$ ions;
    (iv) the magnetic confinement system is further configured to produce a radial confinement magnetic field which confines the radial motion of the plasma away from the longitudinal axis and the radial confinement magnetic field does not substantially extend into the substantially uniform magnetic field;
    (v) the electron cyclotron resonance driver produces a time varying electric field having a frequency substantially de-tuned to the electron cyclotron resonance frequency corresponding to the substantially uniform magnetic field.

2. The ion source of claim 1, wherein the first and second magnetic mirrors each comprise a non-uniform magnetic field, wherein said field:
    is directed substantially along the longitudinal axis, and
    has a magnitude which increases as a function of axial distance from the substantially uniform magnetic field to a peak magnitude greater than the magnitude of the substantially uniform magnetic field; and
    wherein the peak magnitude of the first magnetic mirror is greater than the peak magnitude of the second magnetic mirror.

3. The ion source of claim 2, wherein the peak magnitude of each of the first and second magnetic mirrors is greater than about twice the magnitude of the substantially uniform magnetic field.

4. The ion source of claim 1, wherein the magnitude of the substantially uniform magnetic field is a local axial minimum of the magnetic field in the confinement region.

5. The ion source of claim 1, further comprising an extractor for extracting a beam of ions from the confinement region, wherein the beam comprises a portion of the multiply ionized ions in the selected final ionization state.

6. The ion source of claim 5, wherein the ion beam has a current of 1 mA or greater.

7. The ion source of claim 5, wherein the ion beam has a current of 10 mA or greater.

8. The ion source of claim 5, wherein the ion beam has a current of 20 mA or greater.

9. The ion source of claim 5, wherein the ion beam has a current of 50 mA or greater.

10. The ion source of claim 6, wherein at least 50% of the ions in the beam are in the selected final ionization state.

11. The ion source of claim 10, wherein at least 70% of the ions in the beam are in the selected final ionization state.

12. The ion source of claim 1, wherein the electron cyclotron resonance driver produces a time varying electric field having a frequency substantially tuned to the electron cyclotron resonance frequency corresponding to the substantially uniform magnetic field.

13. The ion source of claim 12, wherein the electron cyclotron resonance driver drives the cyclotron motion of electrons located throughout a volume containing the substantially uniform magnetic field.

14. The ion source of claim 1, wherein the magnitude of the substantially uniform magnetic field varies by less than 10% over a region disposed about the longitudinal axis, said region located midway between the first and second magnetic mirrors and extending along the longitudinal axis over a distance equal to at least about 25% of the axial distance between the first and second magnetic mirrors.

15. The ion source of claim 1, wherein the magnitude of the substantially uniform magnetic field varies by less than 1% over a region extending at least 15 cm along the longitudinal axis.

16. The ion source of claim 1, wherein the magnitude of the substantially uniform magnetic field varies by less than 5% over a region extending at least 15 cm along the longitudinal axis.

17. The ion source of claim 1, wherein the magnitude of the substantially uniform magnetic field varies by less than 10% over a region extending at least 15 cm along the longitudinal axis.

18. The ion source of claim 1, wherein the magnetic field is azimuthally symmetric about the longitudinal axis throughout the confinement region.

19. The ion source of claim 1, wherein the electron cyclotron de-correlation time for electrons driven by the electron cyclotron resonance driver is at least on the order of an average confinement time for a heated electron in the confinement region.

20. The ion source of claim 12, wherein the electron cyclotron resonance driver drives at least a portion of the electrons in the volume to an energy of about 200 eV or more.

21. The ion source of claim 12, wherein the electron cyclotron resonance driver drives at least a portion of the electrons in the volume to an energy of about 300 eV or more.

22. The ion source of claim 12, wherein the electron cyclotron resonance driver drives at least a portion of the electrons in the volume to an energy of about 1 keV or more.

23. The ion source of claim 1, further comprising an ion cyclotron driver, which directs radiation to the confinement region to preferentially drive the cyclotron motion of ions in the plasma having a selected driven ionization state to increase the motional energy of said ions in directions perpendicular to the longitudinal axis.

24. The ion source of claim 23, wherein the ion cyclotron driver preferentially increases the confinement time in the confinement region of the ions having selected driven ionization state, thereby increasing the number of said ions undergoing further ionizing interactions with the electrons in the containment region to form ions having the selected final ionization state.

25. The ion source of claim 24, wherein the ion cyclotron driver directs radiation to the confinement region having a frequency substantially tuned to the ion cyclotron frequency of the ions having the selected driven ionization state in the substantially uniform magnetic field.

26. The ion source of claim 25, wherein the selected driven ionization state is a singly ionized state.

27. The ion source of claim 25, wherein the selected driven ionization state is a multiply ionized state having an ionization state less than the final ionization state.

28. The ion source of claim 24, wherein the ion cyclotron driver directs radiation to the confinement region at a plurality of frequencies each substantially tuned to the ion cyclotron frequency of ions having a respective selected driven ionization state in the substantially uniform magnetic field.

29. The ion source of claim 25, wherein the ion cyclotron driver comprises an antenna chosen from the group consisting of: an untwisted bi-filer antenna and an untwisted filer antenna.

30. The ion source of claim 1, wherein
at least one magnetic mirror comprises a magnetic field extending outside of the confinement region;
the electron cyclotron driver is tuned to the electron cyclotron frequency corresponding to a portion of the magnetic field extending outside of the confinement region to drive the cyclotron motion of unconfined electrons in said portion of the field, wherein said unconfined electrons interact with the gas to form an unconfined plasma; and
the ion source further comprises a sputter target located in the chamber and proximal to said portion of the magnetic field, and biased to attract ions from the unconfined plasma, in response to collisions with the attracted ions, the sputter source emits neutral particles which form at least a portion of the gas of atoms.

31. The ion source of claim 30, wherein at least a portion of the emitted neutral particles interact with the unconfined electrons to form ions which are attracted back to the sputter source.

32. The ion source of claim 31, wherein the sputter target comprises at least one selected from the list consisting of: an annulus of material disposed about the longitudinal axis, an annulus of material disposed about the longitudinal axis and having a target surface which is angled with respect to the longitudinal axis, and target material positioned about and extending along the longitudinal axis.

33. The ion source of claim 1, wherein the gas comprises He atoms, and the magnetic confinement system confines the plasma in the confinement region such that a portion of He atoms in the plasma experience two singly ionizing interactions with the driven electrons to form alpha particles or $^3\text{He}^{++}$ ions.

34. The ion source of claim 33, further comprising an extractor for extracting a beam of He ions from the confinement region, wherein the beam comprises alpha particles or $^3\text{He}^{++}$ ions.

35. The ion source of claim 34, wherein the beam of He ions has a current of 1 mA or greater.

36. The ion source of claim 34, wherein the beam of He ions has a current of 20 mA or greater.

37. The ion source of claim 35, wherein at least 50% of the ions in the beam are alpha particles or $^3\text{He}^{++}$ ions.

38. The ion source of claim 35, wherein at least 70% of the ions in the beam are alpha particles or $^3\text{He}^{++}$ ions.

39. The ion source of claim 35, wherein at least 90% of the ions in the beam are alpha particles or $^3\text{He}^{++}$ ions.

40. The ion source of claim 1, wherein the magnetic confinement system is further configured to produce a radial confinement magnetic field which confines the radial motion of the plasma away from the longitudinal axis;
wherein the radial confinement magnetic field does not substantially extend into the substantially uniform magnetic field.

41. The ion source of claim 40, wherein the magnetic confinement system comprises a multipole radial confinement magnet disposed about the longitudinal axis which produces a magnetic field directed azimuthally to the longitudinal axis and having a magnitude which decreases radially with increasing proximity to the axis, except along one or more cusps.

42. The ion source of claim 40, wherein the multipole magnet comprises 8 or more poles.

43. The ion source of claim 1, wherein the electron cyclotron resonance driver produces a time varying electric field having a frequency substantially de-tuned to the electron cyclotron resonance frequency corresponding to the substantially uniform magnetic field.

44. The ion source of claim 43, wherein:
the electron cyclotron resonance driver drives the cyclotron motion of electrons located in a first region of non-uniform magnetic field distal the substantially uniform magnetic field along the longitudinal axis and a second region of non-uniform magnetic field proximal the substantially uniform magnetic field along the longitudinal axis.

45. The ion source of claim 43, wherein each of the first and second regions of non-uniform magnetic field comprise a surface of points characterized such that the frequency of the time varying electric field is tuned to the electron cyclotron resonance frequency of the non-uniform magnetic field at said points.

46. The ion source of claim 1, wherein the substantially uniform magnetic field has a magnitude of about 0.5 T or greater.

47. The ion source of claim 1, wherein the substantially uniform magnetic field has a magnitude of about 0.6 T or greater.

48. The ion source of claim 1, wherein the gas comprises molecules, and the driven electrons interact with the gas to disassociate the molecules to form the confined plasma.

49. A method of generating an ion beam, comprising:
providing a chamber disposed about a longitudinal axis and containing a gas;
producing a magnetic field in a confinement region within the chamber, wherein the confinement region is disposed about the axis and extends along the axis from a proximal end to a distal end, and wherein the magnetic field comprises:
a first magnetic mirror located at the proximal end of the confinement region;
a second magnetic mirror located at the distal end of the confinement region;
a substantially uniform magnetic field disposed about and directed substantially parallel to the longitudinal axis, the substantially uniform magnetic field being located between the first and second magnetic mirrors;
producing a time varying electric field to drive the cyclotron motion of electrons located within the confinement region;
causing said driven electrons interacting with the gas to form a confined plasma;
confining the plasma in the confinement region such that a portion of atoms in the plasma experience multiple ionizing interactions with the driven electrons to form multiply ionized ions having a selected final ionization state; and
directing radiation to the confinement region to preferentially drive the cyclotron motion of ions in the plasma having a selected driven ionization state to increase the motional energy of said ions in directions perpendicular to the longitudinal axis.

50. The method of claim 49, wherein the first and second magnetic mirrors each comprise a non-uniform magnetic field, wherein said field
is directed substantially along the longitudinal axis and
has a magnitude which increases as a function of axial distance from the substantially uniform magnetic field to a peak magnitude greater than the magnitude of the substantially uniform magnetic field, and
wherein the peak magnitude of the first magnetic mirror is greater than the peak magnitude of the second magnetic mirror.

51. The method of claim 49, wherein a peak magnitude of each of the first and second magnetic mirrors is greater than about twice the magnitude of the substantially uniform magnetic field.

52. The method of claim 49, wherein the magnitude of the substantially uniform magnetic field is a local axial minimum of the magnetic field on the confinement region.

53. The method of 49, further comprising extracting the ion beam from the confinement region, wherein the beam comprises a portion of the ions are in the selected final ionization state.

54. The method of claim 53, wherein the ion beam has a current of 1 mA or greater.

55. The method of claim 53, wherein the ion beam has a current of 10 mA or greater.

56. The method of claim 53, wherein the ion beam has a current of 20 mA or greater.

57. The method of claim 53, wherein the ion beam has a current of 50 mA or greater.

58. The method of claim 54, wherein at least 70% of the ions in the selected final ionization state.

59. The method of claim 54, wherein at least 80% of the ions in the beam are in the selected final ionization state.

60. The method of claim 49, wherein the time varying electric field has a frequency substantially tuned to the electron cyclotron resonance frequency corresponding to the substantially uniform magnetic field.

61. The method of claim 60, the electron cyclotron resonance driver drives the cyclotron motion of electrons located throughout a volume surrounding the substantially uniform magnetic field.

62. The method of claim 49, wherein the magnitude of the substantially uniform magnetic field varies by less than 10% over a region disposed about the longitudinal axis, said region located midway between the first and second magnetic mirrors and extending along the longitudinal axis over a distance equal to at least about 25% of the axial distance between the first and second magnetic mirrors.

63. The method of claim 49, wherein the magnitude of the substantially uniform magnetic field varies by less than 1% over a region extending at least 15 cm along the longitudinal axis.

64. The method of claim 49, wherein the magnitude of the substantially uniform magnetic field varies by less than 5% over a region extending at least 15 cm along the longitudinal axis.

65. The method of claim 49, wherein the magnitude of the substantially uniform magnetic field varies by less than 10% over a region extending at least 15 cm along the longitudinal axis.

66. The method of claim 49, wherein the magnetic field is azimuthally symmetric about the longitudinal axis throughout the confinement region.

67. The method of claim 49, wherein the electron cyclotron de-correlation time for the driven electrons is at least on the order of an average confinement time for a heated electron in the confinement region.

68. The method of claim 49, comprising driving the cyclotron motion of electrons located within the confinement region to produce an electron energy of about 200 eV or more.

69. The method of claim 49, comprising driving the cyclotron motion of electrons located within the confinement region to produce an electron energy of about 300 eV or more.

70. The method of claim 49, comprising driving the cyclotron motion of electrons located within the confinement region to produce an electron energy of about 1 keV or more.

71. The method of claim 49, wherein directing radiation to the confinement region to preferentially drive the cyclotron motion of ions in the plasma having a selected driven ionization state comprises:

preferentially increasing the confinement time in the confinement region of the ions having selected driven ionization state, thereby increasing the number of said atoms undergoing further ionizing interactions with the electrons in the containment region.

72. The method of claim 71, wherein directing radiation to the confinement region to preferentially drive the cyclotron motion of ions in the plasma having a selected driven ionization state comprises:
directing radiation to the confinement region having a frequency substantially tuned to the ion cyclotron frequency of the ions having the selected driven ionization state in the substantially uniform magnetic field.

73. The method of claim 72, wherein the selected driven ionization state is a singly ionized state.

74. The method of claim 72, wherein the selected driven ionization state is a multiply ionized state having an ionization state less than the final ionization state.

75. The method of claim 72, comprising directing radiation to the confinement region at a plurality of frequencies, each frequency substantially tuned to the ion cyclotron frequency of ions having a respective selected driven ionization state in the substantially uniform magnetic field.

76. The method of claim 72 wherein directing radiation to the confinement region to preferentially drive the cyclotron motion of ions in the plasma having a selected driven ionization state comprises:
directing radiation from an antenna chosen from the group consisting of: an untwisted bi-filer antenna and an untwisted filer antenna.

77. The method of claim 70, wherein:
at least one magnetic mirror comprises a magnetic field extending outside of the confinement region;
the frequency of the time varying electric field is tuned to the electron cyclotron frequency corresponding to a portion of the magnetic field extending outside of the confinement region to drive the cyclotron motion of unconfined electrons in said portion of the field, wherein said unconfined electrons interact with the gas to form an unconfined plasma; and
and further comprising:
providing a sputter target located in the chamber and proximal to said portion of the magnetic field;
biasing the sputter target to attract ions from the unconfined plasma, such that, in response to collisions with the attracted ions, the sputter source emits neutral particles which form at least a portion of the gas of atoms.

78. The method of claim 77, wherein at least a portion of the emitted neutral particles interact with the unconfined electrons to form ions which are attracted back to the biased sputter source.

79. The method of claim 78, wherein the sputter target comprises at least one selected from the list consisting of: an annulus of material disposed about the longitudinal axis; an annulus of material disposed about the longitudinal axis and having a target surface which is angled with respect to the longitudinal axis; target material positioned about and extending along the longitudinal axis.

80. A method of generating an ion beam, comprising:
providing a chamber disposed about a longitudinal axis and containing a gas;
producing a magnetic field in a confinement region within the chamber, wherein the confinement region is disposed about the axis and extends along the axis from a proximal end to a distal end, and wherein the magnetic field comprises:
a first magnetic mirror located at the proximal end of the confinement region;
a second magnetic mirror located at the distal end of the confinement region;
a substantially uniform magnetic field disposed about and directed substantially parallel to the longitudinal axis, the substantially uniform magnetic field being located between the first and second magnetic mirrors;
producing a time varying electric field to drive the cyclotron motion of electrons located within the confinement region;
causing said driven electrons interacting with the gas to form a confined plasma;
confining the plasma in the confinement region such that a portion of atoms in the plasma experience multiple ionizing interactions with the driven electrons to form multiply ionized ions having a selected final ionization state, wherein the gas comprises He atoms, and comprising:
confining the plasma in the confinement region such that a portion of the He atoms in the plasma experience two singly ionizing interactions with the driven electrons to form alpha particles.

81. The method of claim 80, further comprising extracting a beam of He ions from the confinement region, wherein the beam comprises alpha particles or $^3He^{++}$ ions.

82. The method of claim 81, wherein the beam of He ions has a current of 1 mA or greater.

83. The method of claim 81, wherein the beam of He ions has a current of 20 mA or greater.

84. The method of claim 82, wherein at least 50% of the ions in the beam are alpha particles or $^3He^{++}$ ions.

85. The method of claim 82, wherein at least 70% of the ions in the beam are alpha particles or $^3He^{++}$ ions.

86. The method of claim 82, wherein at least 90% of the ions in the beam are alpha particles or $^3He^{++}$ ions.

87. The method of claim 49, further comprising producing a radial confinement magnetic field which confines the plasma radially;
wherein the radial confinement magnetic field does not substantially extend into the substantially uniform magnetic field.

88. The method of claim 87, wherein producing a radial confinement magnetic field comprises producing a magnetic field directed azimuthally to the longitudinal axis and having a magnitude which decreases radially with increasing proximity to the axis, except along one or more cusps.

89. The method of claim 49, comprising producing a time varying electric field having a frequency substantially detuned to the electron cyclotron resonance frequency corresponding to the substantially uniform magnetic field.

90. The method of claim 89, comprising:
driving the cyclotron motion of electrons located in a first region of non-uniform magnetic field distal the substantially uniform magnetic field along the longitudinal axis and a second region of non-uniform magnetic field proximal the substantially uniform magnetic field along the longitudinal axis.

91. The method of claim 90, wherein each of the first and second regions of non-uniform magnetic field comprise a surface of points at which the frequency of the time varying electric field is tuned to the electron cyclotron resonance frequency of the non-uniform magnetic field at said points.

92. The method of claim 91, further comprising effecting stochastic heating of electrons in the confinement region which pass through the first and second regions multiple times.

93. The method of claim 49, wherein the substantially uniform magnetic field has a magnitude of about 0.5 T or greater.

94. The method of claim 49, wherein the substantially uniform magnetic field has a magnitude of about 0.6 T or greater.

95. The method of claim 49, wherein the gas comprises molecules, and the causing said driven electrons interacting with the gas to form a confined plasma comprises disassociating the molecules.

* * * * *